United States Patent
Miyazawa

(10) Patent No.: US 9,757,857 B2
(45) Date of Patent: Sep. 12, 2017

(54) PIEZOELECTRIC DRIVING DEVICE AND DRIVING METHOD THEREOF, ROBOT AND DRIVING METHOD THEREOF

(71) Applicant: Seiko Epson Corporation, Tokyo (JP)

(72) Inventor: Osamu Miyazawa, Shimosuwa (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 14/824,350

(22) Filed: Aug. 12, 2015

(65) Prior Publication Data

US 2016/0049887 A1    Feb. 18, 2016

(30) Foreign Application Priority Data

Aug. 13, 2014   (JP) ................. 2014-164620

(51) Int. Cl.
| | |
|---|---|
| *B25J 9/16* | (2006.01) |
| *B25J 15/02* | (2006.01) |
| *H02N 2/00* | (2006.01) |
| *B25J 9/12* | (2006.01) |
| *F04B 43/08* | (2006.01) |
| *H01L 41/332* | (2013.01) |
| *H02N 2/10* | (2006.01) |

(52) U.S. Cl.
CPC ............ *B25J 9/12* (2013.01); *F04B 43/082* (2013.01); *H01L 41/332* (2013.01); *H02N 2/004* (2013.01); *H02N 2/103* (2013.01); *Y10S 901/23* (2013.01)

(58) Field of Classification Search
CPC .................. B25J 9/12; H02N 2/001
USPC .... 294/213, 907, 86.4, 99.1; 901/39, 30, 31, 901/36; 310/323.02
See application file for complete search history.

(56) References Cited

U.S. PATENT DOCUMENTS

| | | | | |
|---|---|---|---|---|
| 4,610,475 A | * | 9/1986 | Heiserman | B25J 9/1085 294/86.4 |
| 4,666,198 A | * | 5/1987 | Heiserman | B25J 9/12 294/118 |
| 4,667,997 A | * | 5/1987 | Udagawa | B25J 13/082 294/86.4 |
| 7,224,102 B2 | * | 5/2007 | Miyazawa | H02N 2/103 310/323.02 |
| 7,489,143 B2 | * | 2/2009 | Konno | B25J 7/00 269/86 |
| 7,692,362 B2 | | 4/2010 | Lee et al. | |
| 2011/0025171 A1 | * | 2/2011 | Goto | G01N 29/12 310/328 |
| 2012/0316675 A1 | * | 12/2012 | Urano | B25J 15/0009 700/245 |

(Continued)

FOREIGN PATENT DOCUMENTS

| | | |
|---|---|---|
| JP | S53-112643 | 10/1978 |
| JP | S59-032039 | 10/1978 |

(Continued)

*Primary Examiner* — Paul T Chin
(74) *Attorney, Agent, or Firm* — Harness, Dickey & Pierce, P.L.C.

(57) ABSTRACT

A piezoelectric driving device includes: a piezoelectric vibrating body which includes a plurality of piezoelectric elements each formed of a first electrode, a second electrode, and a piezoelectric body positioned between the first electrode and the second electrode, and is disposed at least one surface of the first surface and the second surface of the vibrating plate, wherein the plurality of piezoelectric elements are connected in series.

20 Claims, 16 Drawing Sheets

(56) References Cited

U.S. PATENT DOCUMENTS

| | | | |
|---|---|---|---|
| 2013/0141716 A1* | 6/2013 | Mizushima | G01N 21/13 356/244 |
| 2013/0255427 A1* | 10/2013 | Mizushima | B25J 18/00 74/490.03 |
| 2016/0049886 A1* | 2/2016 | Hashimoto | H02N 2/103 310/317 |
| 2016/0114492 A1* | 4/2016 | Arakawa | B25J 9/126 414/735 |
| 2016/0226404 A1* | 8/2016 | Kajino | H01L 41/042 |
| 2016/0284968 A1* | 9/2016 | Miyazawa | H02N 2/0015 |
| 2016/0294306 A1* | 10/2016 | Kobayashi | H02N 2/001 |
| 2016/0365809 A1* | 12/2016 | Takahashi | B25J 9/12 |
| 2017/0001306 A1* | 1/2017 | Arakawa | B25J 9/12 |

FOREIGN PATENT DOCUMENTS

| | | |
|---|---|---|
| JP | 2004-320979 A | 11/2004 |
| JP | 2009-033709 A | 2/2009 |
| JP | 2009-266921 A | 11/2009 |

* cited by examiner

FIG. 7B  S110 ⇩ INSULATING LAYER FORMATION

FIG. 7C  S120 ⇩ FIRST ELECTRODE FORMATION

FIG. 7D  S130 ⇩ PIEZOELECTRIC LAYER FORMATION

FIG. 7E  S140 ⇩ SECOND ELECTRODE FORMATION

FIG. 7F  S150 ⇩ SECOND ELECTRODE AND PIEZOELECTRIC BODY PATTERNING

FIG. 8G    S160 ⇩ FIRST ELECTRODE PATTERNING

FIG. 8H    S170 ⇩ INSULATING LAYER FORMATION AND PATTERNING

FIG. 8I    S180 ⇩ CONDUCTOR LAYER FORMATION FOR LEAD ELECTRODE

PIEZOELECTRIC DRIVING DEVICE AND DRIVING METHOD THEREOF, ROBOT AND DRIVING METHOD THEREOF

BACKGROUND

1. Technical Field

The present invention relates to a piezoelectric driving device and a driving method thereof, and a robot and a driving method thereof.

2. Related Art

A piezoelectric actuator (piezoelectric driving device), which vibrates a piezoelectric body to drive a body to be driven, does not need a magnet or a coil, and accordingly, it is used in various fields (for example, see JP-A-2004-320979). A basic configuration of this piezoelectric driving device is a configuration in which four piezoelectric elements are arranged on each of two surfaces of a reinforcing plate to have two rows and two columns, and accordingly, eight piezoelectric elements in total are provided on both sides of the reinforcing plate. Each piezoelectric element is a unit in which a piezoelectric body is interposed between two electrodes and the reinforcing plate is also used as one electrode of the piezoelectric element. A protrusion which comes in contact with a rotor, which is a body to be driven, to rotate the rotor is provided on one end of the reinforcing plate. When the AC voltage is applied to two piezoelectric elements diagonally disposed among the four piezoelectric elements, the two piezoelectric elements perform an expansion and contraction operation, and accordingly, the protrusion of the reinforcing plate performs a reciprocal operation or an elliptic operation. The rotor, which is a body to be driven, rotates in a predetermined rotation direction according to the reciprocal operation or the elliptic operation of the protrusion of the reinforcing plate. In addition, it is possible to rotate the rotor in a reverse direction, by switching the two piezoelectric elements to be targets of application of the AC voltage, with the other two piezoelectric elements.

In the piezoelectric driving device described above, since two diagonally disposed piezoelectric elements are connected in parallel, capacitance is large and a great current is necessary for driving. When the piezoelectric driving device is accommodated and used in a small space (for example, in a joint of a robot), wiring space may be insufficient in a case of the piezoelectric driving device using a piezoelectric body of the related art, and accordingly, it is desired to decrease the thickness of the piezoelectric body. However, since the capacitance is inversely proportional to a distance between electrodes interposing the piezoelectric body, the capacitance may increase, when the thickness of the piezoelectric body is decreased.

SUMMARY

An advantage of some aspects of the invention is to solve at least a part of the problems described above, and the invention can be implemented as the following forms or application examples.

(1) An aspect of the invention provides a piezoelectric driving device. The piezoelectric driving device includes: a piezoelectric vibrating body which includes a plurality of piezoelectric elements each formed of a first electrode, a second electrode, and a piezoelectric body positioned between the first electrode and the second electrode, and is disposed at least one surface of the first surface and the second surface of the vibrating plate, wherein the plurality of piezoelectric elements are connected in series. According to this aspect, since the plurality of piezoelectric elements are connected in series, it is possible to decrease capacitance of the entirety of piezoelectric elements.

(2) In the piezoelectric driving device according to the aspect described above, a size of the plurality of piezoelectric elements may be the same. According to this aspect, since the magnitude of the capacitance of the plurality of piezoelectric elements is the same, the magnitude of the voltage applied to each piezoelectric element is the same magnitude, and it is possible to improve durability.

(3) In the piezoelectric driving device according to the aspect described above, a direction of polarization of the plurality of piezoelectric elements may be the same, when a driving voltage is applied to the plurality of piezoelectric elements. According to this aspect, since the direction of polarization in the boundary portions of the plurality of piezoelectric elements does not change, it is possible to improve durability of the piezoelectric element.

(4) In the piezoelectric driving device according to the aspect described above, the direction of polarization may be a direction from the second electrode to the first electrode. When the direction of polarization is a direction from the second electrode to the first electrode, the durability is great, compared to a direction from the first electrode to the second electrode.

(5) In the piezoelectric driving device according to the aspect described above, a second electrode of a first piezoelectric element and a second electrode of a second piezoelectric element among the plurality of piezoelectric elements may form one continuous electrode. According to this aspect, it is possible to connect the piezoelectric elements in series, without using wirings or wiring layers.

(6) In the piezoelectric driving device according to the aspect described above, the piezoelectric vibrating body may be disposed on both surfaces of the first surface and the second surface of the vibrating plate. According to this aspect, since the piezoelectric elements are disposed on both surfaces of the first surface and the second surface of the vibrating plate, it is possible to increase a driving force of the piezoelectric driving device.

(7) In the piezoelectric driving device according to the aspect described above, a piezoelectric element of the piezoelectric vibrating body disposed on the first surface and a piezoelectric element of the piezoelectric vibrating body disposed on the second surface may be connected in series. According to this aspect, it is possible to further decrease capacitance.

(8) In the piezoelectric driving device according to the aspect described above, a substrate may be formed between the plurality of first electrodes and the vibrating plate. In order to extract a great amount of energy from the piezoelectric element, a mechanical quality factor Qm may be increased so as to obtain a great amplitude in a resonance state. According to this aspect, since the substrate is provided between the plurality of first electrodes and the vibrating plate, it is possible to increase the mechanical quality factor Qm of the piezoelectric driving device, compared to a case where no substrate is provided.

(9) In the piezoelectric driving device according to the aspect described above, the substrate may contain silicon. A value of the mechanical quality factor Qm of the piezoelectric element is several thousands, whereas, a value of the mechanical quality factor Qm of silicon is approximately 100,000. Therefore, according to this aspect, it is possible to increase the mechanical quality factor Qm of the piezoelectric driving device.

(10) In the piezoelectric driving device according to the aspect described above, the vibrating plate may include a protrusion which comes in contact with a body to be driven. According to this aspect, it is possible to drive a body to be driven by pressing the body to be driven using the protrusion.

(11) Another aspect of the invention provides a robot. The robot includes: a plurality of linking portions; joints connected to the plurality of linking portions; and the piezoelectric driving device according to any one of the above aspects which rotates the plurality of linking portions using the joints. According to this aspect, it is possible to use the piezoelectric driving device in driving of the robot.

(12) Still another aspect of the invention provides a driving method of the robot. The driving method includes driving the piezoelectric driving device by applying a voltage which periodically changes, between the first electrode and the second electrode of the piezoelectric driving device, to rotate the plurality of linking portions using the joints.

(13) Yet another aspect of the invention provides a driving method of the piezoelectric driving device of the aspect described above. The driving method includes: applying an undulating voltage which is a voltage which periodically changes and in which a direction of an electric field applied to a piezoelectric body of piezoelectric elements is one direction from one electrode among the electrodes to another electrode, between a first electrode and a second electrode of the piezoelectric element. According to this aspect, since a direction of the voltage applied to the piezoelectric body of the piezoelectric element is only one direction, it is possible to improve durability of the piezoelectric body.

The invention can be implemented in various forms, and, for example, can be implemented in various embodiments of a driving method of a piezoelectric driving device, a manufacturing method of a piezoelectric driving device, a robot including a piezoelectric driving device mounted thereon, a driving method of a robot including a piezoelectric driving device mounted thereon, an electronic component conveying apparatus, a liquid feeding pump, and a pump for medication, in addition to the piezoelectric driving device.

BRIEF DESCRIPTION OF THE DRAWINGS

The invention will be described with reference to the accompanying drawings, wherein like numbers reference like elements.

FIGS. 7A to 7F are explanatory diagrams showing a manufacturing process of the piezoelectric vibrating body in Step S100 of FIG. 6.

FIGS. 8F to 8I are explanatory diagrams showing a manufacturing process of the piezoelectric vibrating body in Step S100 of FIG. 6.

DESCRIPTION OF EXEMPLARY EMBODIMENTS

First Embodiment

Figure 1A:
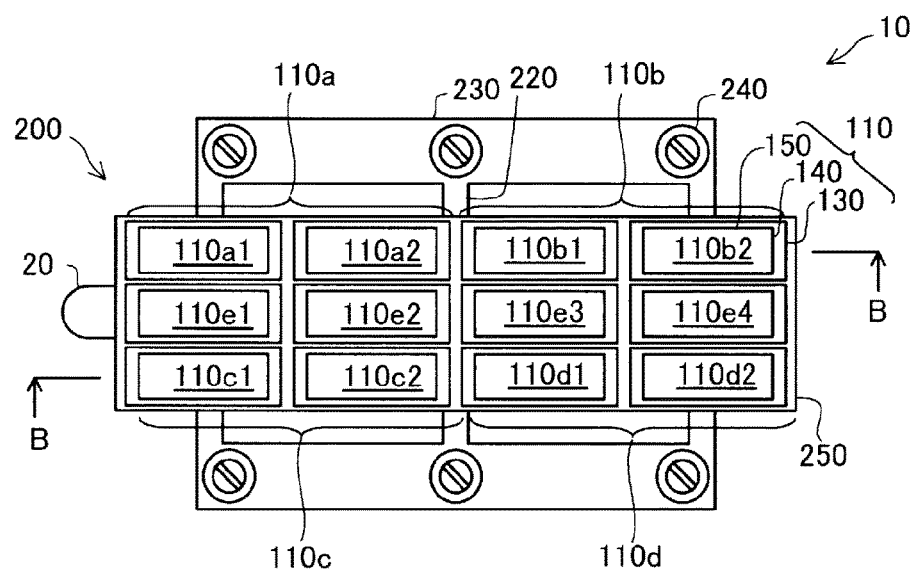
FIGS. 1A and 1B are respectively a plan view and a sectional view showing a schematic configuration of a piezoelectric driving device of a first embodiment.
Figure 1B:
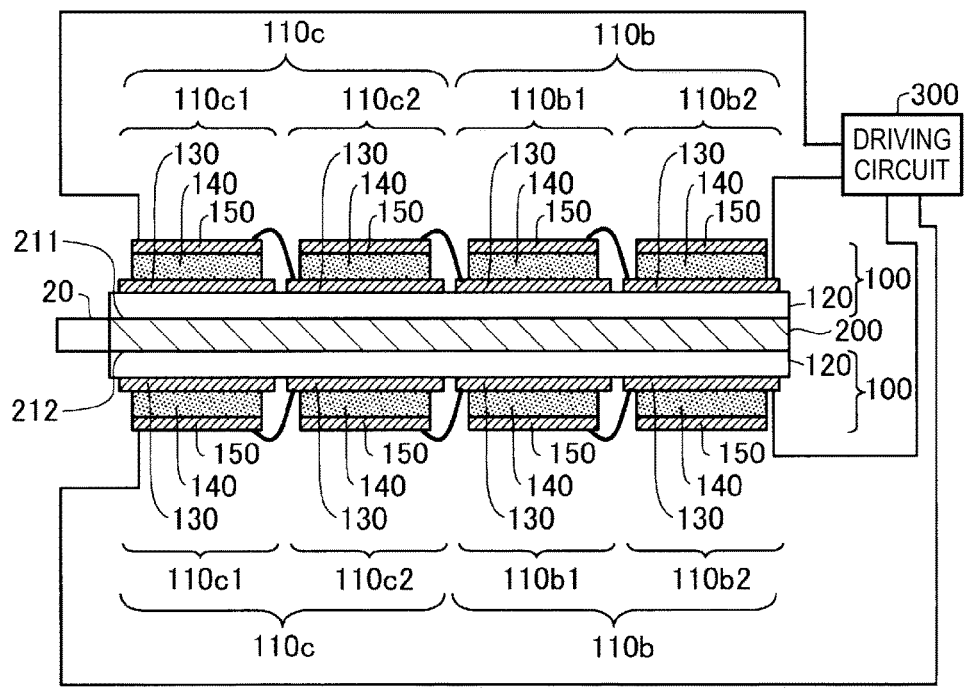

FIG. 1A is a plan view showing a schematic configuration of a piezoelectric driving device 10 of a first embodiment of the invention and FIG. 1B is a sectional view taken along line B-B. A piezoelectric driving device 10 includes a vibrating plate 200, and two piezoelectric vibrating bodies 100 respectively disposed on both surfaces (a first surface 211 and a second surface 212) of the vibrating plate 200. The two piezoelectric vibrating bodies 100 are symmetrically disposed with the vibrating plate 200 as a center. Since the two piezoelectric vibrating bodies 100 have the same configuration, the configuration of the piezoelectric vibrating body 100 on the upper side of the vibrating plate 200 will be described hereinafter, unless otherwise noted.

The piezoelectric vibrating body 100 includes a substrate 120, and a plurality of piezoelectric elements 110a1, 110a2, 110b1, 110b2, 110c1, 110c2, 110d1, 110d2, 110e1, 110e2, 110e3, and 110e4 which are formed on the substrate 120. Since each piezoelectric element has the same structure, the piezoelectric elements are collectively referred to as the "piezoelectric element 110", when it is not necessary to distinguish the piezoelectric elements from each other.

The piezoelectric element 110 includes a first electrode 130, a piezoelectric body 140 formed on the first electrode 130, and a second electrode 150 formed on the piezoelectric body 140. The first electrode 130 and the second electrode 150 interpose the piezoelectric body 140 therebetween. The piezoelectric element 110 can be formed by dividing one large piezoelectric element including one continuous piezoelectric body and two continuous conductor layers (first electrode and second electrode) interposing the piezoelectric body into a plurality of pieces (a plurality of piezoelectric elements) by a physical or chemical method such as ion milling or dry etching. The piezoelectric elements 110e1 to 110e4 are formed in a substantially rectangular shape and are formed along a longitudinal direction of the substrate 120 in the center of the substrate 120 in a width direction. The piezoelectric elements 110a1 and 110a2 are arranged along the longitudinal direction and form a piezoelectric element group 110a. The same applies to the piezoelectric elements 110b1 and 110b2, 110c1 and 110c2, and 110d1 and 110d2, and these piezoelectric elements respectively form piezoelectric element groups 110b, 110c, and 110d. The piezoelectric element groups 110a, 110b, 110c, and 110d are formed in positions of four corners of the substrate 120.

The substrate 120 of the piezoelectric vibrating body 100 is used as a substrate for forming the first electrode, the piezoelectric body, and the second electrode in a film forming process. The substrate 120 also has a function as a vibrating plate which performs mechanical vibration. The substrate 120 can be formed of Si, $Al_2O_3$, or $ZrO_2$, for example. As the substrate 120 formed of Si (also referred to as a "silicon substrate 120"), a Si wafer for semiconductor manufacturing can be used, for example. In the embodiment, a planar shape of the substrate 120 is a rectangle. A thickness of the substrate 120 is, for example, preferably in a range of 10 μm to 100 μm. When the thickness of the substrate 120 is equal to or greater than 10 μm, it is possible to comparatively easily treat the substrate 120, at the time of performing a film forming process on the substrate 120. In addition, when the thickness of the substrate 120 is equal to or greater than 50 μm, it is possible to more easily treat the substrate 120. When the thickness of the substrate 120 is equal to or smaller than 100 μm, it is possible to easily vibrate the substrate 120 according to expansion and contraction of the piezoelectric body formed of a thin film.

As described above, the first electrode or the second electrode before performing dividing, is a thin film which is formed by sputtering, for example. As a material of the first electrode or the second electrode, any material having high conductivity such as Al (aluminum), Ni (nickel), Au (gold), Pt (platinum), or Ir (iridium) can be used, for example. Wiring (or a wiring layer or an insulating layer) for electrically connecting the first electrode 130, the second electrode 150, and a driving circuit with each other is not shown in FIGS. 1A and 1B.

The piezoelectric body before performing driving, has a thin film shape which is formed by a sol-gel method or a sputtering method, for example. As a material of the piezoelectric body, any material exhibiting a piezoelectric effect such as ceramics having an $ABO_3$ type perovskite structure can be used. Examples of the ceramics having an $ABO_3$ type perovskite structure include lead zirconate titanate (PZT), barium titanate, lead titanate, potassium niobate, lithium niobate, lithium tantalate, sodium tungstate, zinc oxide, barium strontium titanate (BST), strontium bismuth tantalate (SBT), lead metaniobate, zinc niobate lead, and scandium niobate. As a material exhibiting a piezoelectric effect other than the ceramics, polyvinylidene fluoride or crystal can also be used, for example. A thickness of the piezoelectric body is, for example, preferably in a range of 50 nm (0.05 μm) to 20 μm. A thin film of the piezoelectric body 140 having a thickness of this range can easily be formed by using a film forming process. When the thickness of the piezoelectric body is equal to or greater than 0.05 μm, it is possible to generate sufficiently great power according to expansion and contraction of the piezoelectric body. When the thickness of the piezoelectric body is equal to or smaller than 20 μm, it is possible to sufficiently miniaturize the piezoelectric driving device 10.

Figure 2:
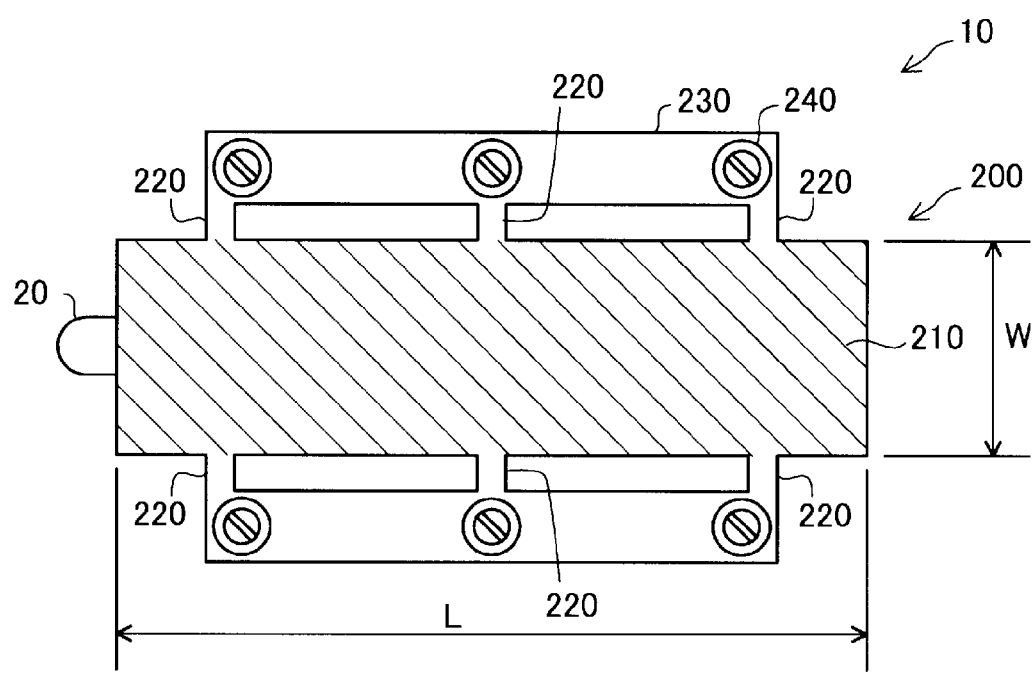
FIG. 2 is a plan view of a vibrating plate.

FIG. 2 is a plan view of the vibrating plate 200. The vibrating plate 200 includes a rectangular vibrator portion 210, three connection portions 220 which extend from right and left long sides of the vibrator portion 210, and two attachment portions 230 which are connected to the respective three connection portions 220 on both right and left sides. In FIG. 2, for convenience of description, an area of the vibrator portion 210 is hatched. The attachment portions 230 are used for attaching the piezoelectric driving device 10 to another member with screws 240. The vibrating plate 200, for example, can be formed with a metal material such as stainless steel, aluminum, an aluminum alloy, titanium, a titanium alloy, copper, or a copper alloy.

The piezoelectric vibrating bodies 100 (FIGS. 1A and 1B) are respectively bonded on an upper surface (first surface) and a lower surface (second surface) of the vibrator portion 210 using an adhesive. A ratio of a length L and a width W of the vibrator portion 210 is preferably approximately L:W=7:2. This ratio is a preferable value for performing ultrasonic vibration (which will be described later) in which the vibrator portion 210 curves to the right and left along the flat surface thereof. The length L of the vibrator portion 210 can be set, for example, in a range of 3.5 mm to 30 mm and the width W thereof can be set, for example, in a range of 1 mm to 8 mm. Since the vibrator portion 210 performs ultrasonic vibration, the length L thereof is preferably equal to or smaller than 50 mm. A thickness of the vibrator portion 210 (thickness of vibrating plate 200) can be set, for example, in a range of 50 μm to 700 μm. When the thickness of the vibrator portion 210 is equal to or greater than 50 μm, sufficient rigidity for supporting the piezoelectric vibrating body 100 is obtained. When the thickness of the vibrator portion 210 is equal to or smaller than 700 μm, sufficiently great deformation can occur according to deformation of the piezoelectric vibrating body 100.

A protrusion 20 (also referred to as a "contacting portion" or an "operating portion") is provided on one short side of the vibrating plate 200. The protrusion 20 is a member which comes in contact with a body to be driven to apply force to a body to be driven. The protrusion 20 is preferably formed of a material having durability such as ceramics (for example, $Al_2O_3$).

Figure 3:
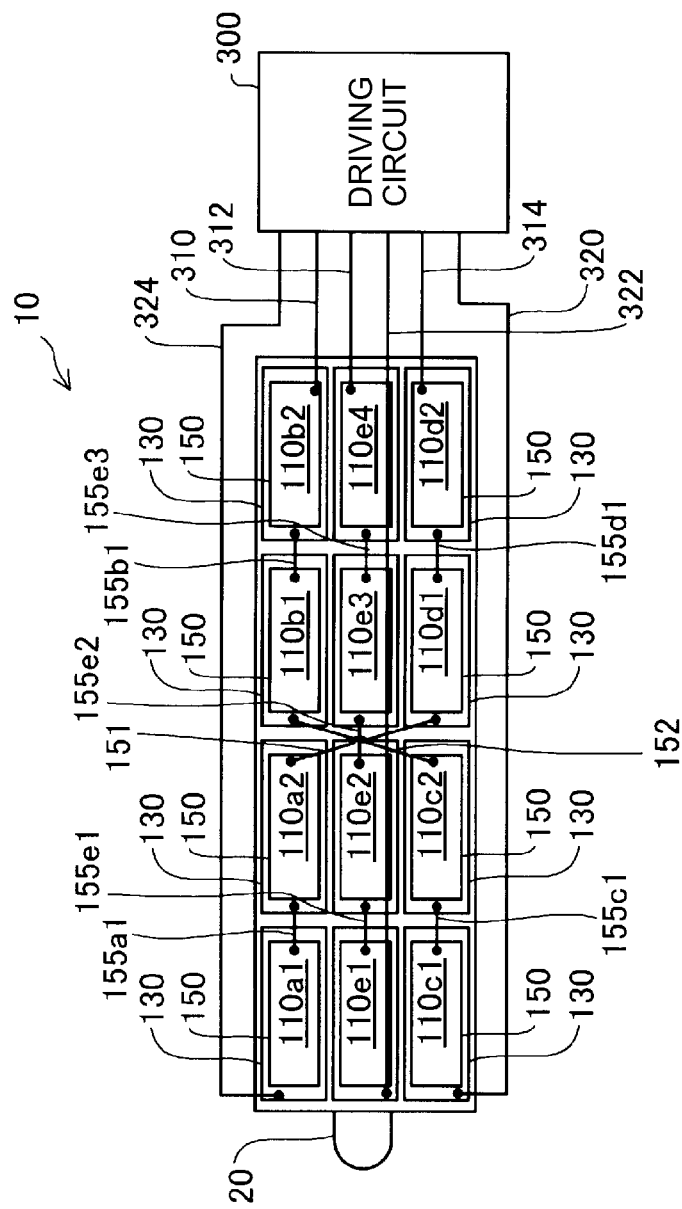
FIG. 3 is an explanatory diagram showing an electrical connection state of the piezoelectric driving device and a driving circuit.

FIG. 3 is an explanatory diagram showing an electrical connection state of the piezoelectric driving device 10 and a driving circuit 300. In the embodiment, the piezoelectric elements are divided into three groups, each of which includes four piezoelectric elements. A first group includes the piezoelectric elements 110c1, 110c2, 110b1, and 110b2. A second group includes the piezoelectric elements 110a1, 110a2, 110d1, and 110d2. A third group includes piezoelectric elements 110e1, 110e2, 110e3, and 110e4.

The wiring is implemented in the first group as follows.
The driving circuit 300 and the first electrode 130 of the piezoelectric element 110c1 are wired by a wiring 320.
The second electrode 150 of the piezoelectric element 110c1 and the first electrode 130 of the piezoelectric element 110c2 are wired by a wiring 155c1.
The second electrode 150 of the piezoelectric element 110c2 and the first electrode 130 of the piezoelectric element 110b1 are wired by a wiring 152.
The second electrode 150 of the piezoelectric element 110b1 and the first electrode 130 of the piezoelectric element 110b2 are wired by a wiring 155b1.
The second electrode 150 of the piezoelectric element 110b2 and the driving circuit 300 are wired by a wiring 310.

With this wiring, the piezoelectric elements 110c1, 110c2, 110b1, and 110b2 are wired in series.

The wiring is implemented in the second group as follows.
The driving circuit 300 and the first electrode 130 of the piezoelectric element 110a1 are wired by a wiring 324.

The second electrode 150 of the piezoelectric element 110a1 and the first electrode 130 of the piezoelectric element 110a2 are wired by a wiring 155a1.

The second electrode 150 of the piezoelectric element 110a2 and the first electrode 130 of the piezoelectric element 110d1 are wired by a wiring 151.

The second electrode 150 of the piezoelectric element 110d1 and the first electrode 130 of the piezoelectric element 110d2 are wired by a wiring 155d1.

The second electrode 150 of the piezoelectric element 110d2 and the driving circuit 300 are wired by a wiring 314.

With this wiring, the piezoelectric elements 110a1, 110a2, 110d1, and 110d2 are wired in series.

The wiring is implemented in the third group as follows.

The driving circuit 300 and the first electrode 130 of the piezoelectric element 110e1 are wired by a wiring 322.

The second electrode 150 of the piezoelectric element 110e1 and the first electrode 130 of the piezoelectric element 110e2 are wired by a wiring 155e1.

The second electrode 150 of the piezoelectric element 110e2 and the first electrode 130 of the piezoelectric element 110e3 are wired by a wiring 155e2.

The second electrode 150 of the piezoelectric element 110e3 and the first electrode 130 of the piezoelectric element 110e4 are wired by a wiring 155e3.

The second electrode 150 of the piezoelectric element 110e4 and the driving circuit 300 are wired by a wiring 312.

With this wiring, the piezoelectric elements 110e1, 110e2, 110e3, and 110e4 are wired in series.

The wirings 151, 152, and 155a1 to 155e3 may be formed by a film forming process or may be implemented by wire-shaped wiring. By applying an AC voltage or an undulating voltage which periodically changes, between the wirings 314 and 324, the driving circuit 300 can cause the piezoelectric driving device 10 to perform ultrasonic vibration and rotate a rotor (body to be driven) which comes in contact with the protrusion 20, in a predetermined rotation direction. Herein, the "undulating voltage" means a voltage obtained by applying DC offset to the AC voltage, and a direction of the voltage (electric field) thereof is a direction from one electrode to the other electrode. In addition, by applying an AC voltage or an undulating voltage between the wirings 310 and 320, a rotor which comes in contact with the protrusion 20 can be rotated in a reverse direction. The application of the voltage can be simultaneously performed on the two piezoelectric vibrating bodies 100 provided on both surfaces of the vibrating plate 200. A wiring (or a wiring layer or an insulating layer) configuring the wirings 151, 152, 155a1 to 155e3, 310, 312, 314, 320, 322, and 324 shown in FIG. 3 is not shown in FIGS. 1A and 1B.

In the embodiment, the capacitance of the piezoelectric driving device 10 when seen from the driving circuit 300 side, is decreased due to the following effects.

(1) Effect of area: The areas of the first electrode 130 and the second electrode 150 of the piezoelectric element 110 of the embodiment is half of the areas of a first electrode and a second electrode of a piezoelectric element shown in FIG. 6 of JP-A-2004-320979. Since the capacitance is proportional to the area of the electrode, the capacitance of the piezoelectric element is decreased by ½.

(2) Effect of series connection: Since N (N is an integer equal to or larger than 2) capacitive elements including the same capacitance C are generally connected in series, the total capacitance is obtained by C/N. In the embodiment, since the four piezoelectric elements having substantially the same shape are connected in series, the composite capacitance is decreased by ¼. Meanwhile, when M (M is an integer equal to or larger than 2) capacitive elements including the same capacitance C are connected in parallel, the composite capacitance is obtained by M×C. In JP-A-2004-320979, since the two piezoelectric elements are connected in parallel, the composite capacitance is obtained as 2C. In comparison with that in JP-A-2004-320979, the composite capacitance of the piezoelectric element of the embodiment is decreased by ⅛. With both effects described above, when the composite capacitance of the piezoelectric element in JP-A-2004-320979 is set as 1, the composite capacitance of the four piezoelectric elements connected in series is decreased by 1/16. As described above, the piezoelectric elements are divided to have piezoelectric elements and are connected in series, and accordingly the capacitance can be decreased.

Figure 4:
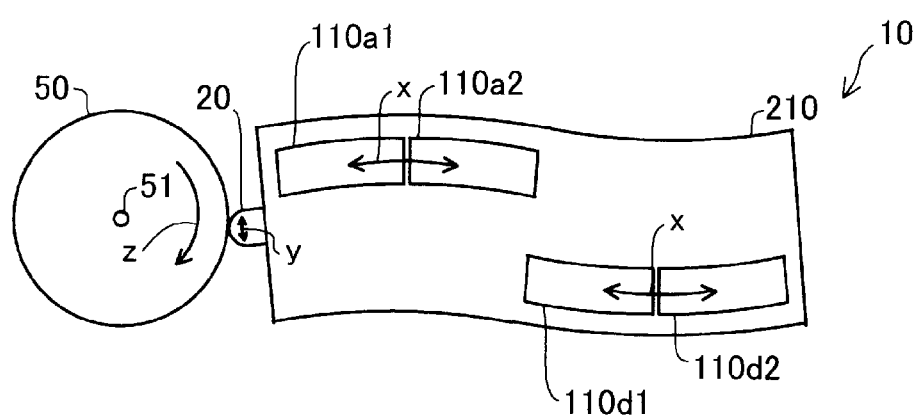
FIG. 4 is an explanatory diagram showing an example of operations of the piezoelectric driving device.

FIG. 4 is an explanatory diagram showing an example of operations of the piezoelectric driving device 10. The protrusion 20 of the piezoelectric driving device 10 comes in contact with an outer circumference of a rotor 50 which is a body to be driven. In an example shown in FIG. 4, the driving circuit 300 (FIG. 3) applies an AC voltage or an undulating voltage to the four piezoelectric elements 110a, 110a2, 110d1, and 110d2 which are connected in series, and accordingly, the piezoelectric elements 110a, 110a2, 110d1, and 110d2 expand or contract in a direction of an arrow x shown in FIG. 4. According to this, the vibrator portion 210 of the piezoelectric driving device 10 curves in a flat surface of the vibrator portion 210 to be deformed in a meander shape (S shape), and a tip end of the protrusion 20 performs a reciprocal operation or an elliptic operation in a direction of an arrow y. As a result, the rotor 50 is rotated around the center 51 thereof in a predetermined direction z (clockwise in FIG. 4). The three connection portions 220 (FIG. 2) of the vibrating plate 200 described in FIG. 2 are provided at a position of a node of vibration of the vibrator portion 210. When the driving circuit 300 applies an AC voltage or an undulating voltage to the other four piezoelectric elements 110c1, 110c2, 110b1, and 110b2, the rotor 50 is rotated in a reverse direction. When the AC voltage or the undulating voltage is applied to the four piezoelectric elements 110e1, 110e2, 110e3, and 110e4 in the center, the piezoelectric driving device 10 expands or contracts in a longitudinal direction, and accordingly, it is possible to increase the magnitude of force applied to the rotor 50 from the protrusion 20. Such an operation regarding the piezoelectric driving device 10 (or piezoelectric vibrating body 100) is disclosed in JP-A-2004-320979 or U.S. Pat. No. 7,224,102 thereof, and the disclosed content thereof is incorporated by reference.

Figure 5A:
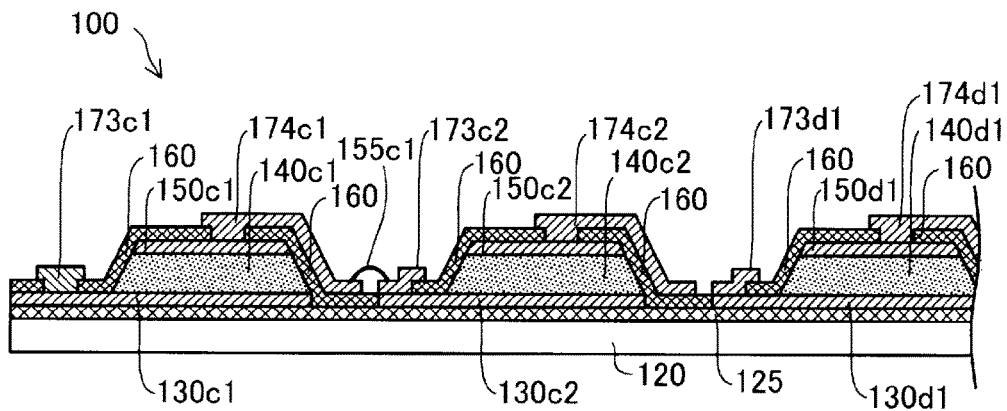
FIGS. 5A to 5C are sectional views specifically showing an example of a sectional structure shown in FIGS. 1A and 1B.
Figure 5B:
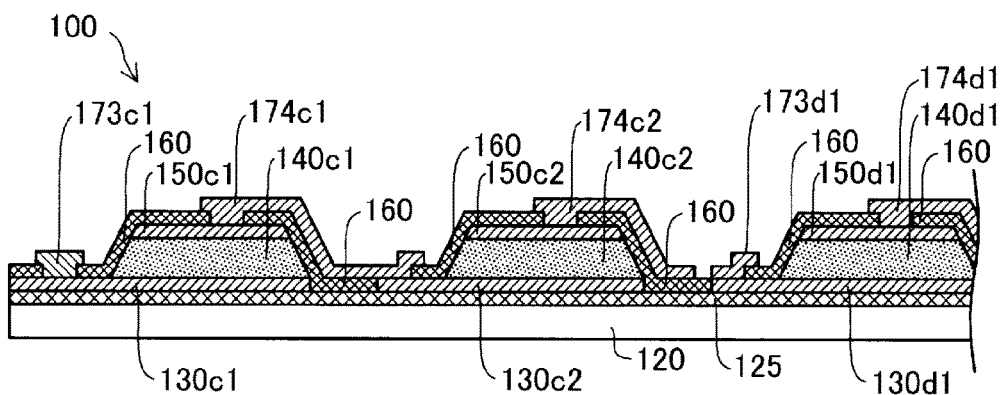
Figure 5C:
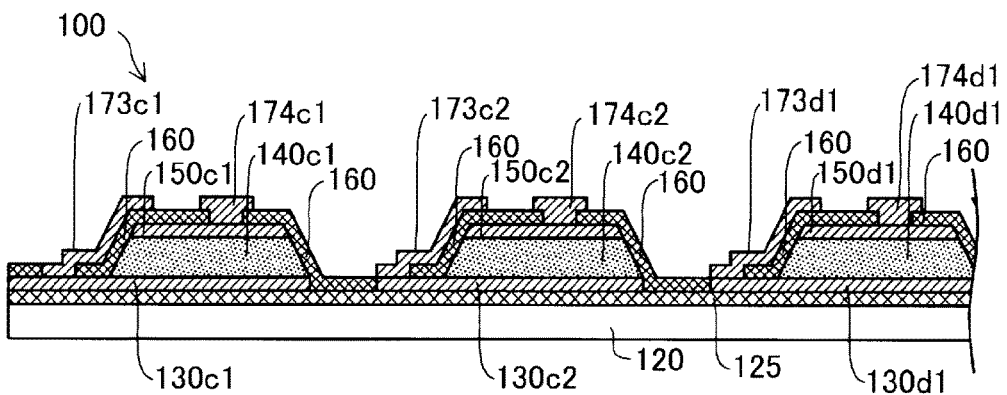

FIGS. 5A to 5C are sectional views specifically showing an example of a sectional structure shown in FIG. 1B. FIGS. 5A to 5C show a part of the piezoelectric vibrating body 100. FIG. 5A shows a configuration used when the wiring between the first electrode and the second electrode of the piezoelectric element is formed by a wire-shaped wiring 155c1. FIG. 5B shows a configuration used when the wiring between the first electrode and the second electrode of the piezoelectric element is formed by a film forming process. FIG. 5C shows a configuration used when a wiring layer is formed on another plate-shaped member, for example, the vibrating plate 200 (FIGS. 1A and 1B) and the wiring between the first electrode and the second electrode of the piezoelectric element is formed using the wiring layer. However, even in a case of the configuration shown in FIG.

5C, the wiring between the first electrode and the second electrode of the piezoelectric element may be formed by a wire-shaped wiring.

The piezoelectric vibrating body 100 includes the substrate 120, an insulating layer 125, first electrodes 130c1, 130c2, and 130d1, piezoelectric bodies 140c1, 140c2, and 140d1, second electrodes 150c1, 150c2, and 150d1, an insulating layer 160, and lead electrodes 173c1, 173c2, 173d1, 174c1, 174c2, and 174d1. In the configurations of FIGS. 5A to 5C, the shapes of the lead electrodes 173c1, 173c2, 173d1, 174c1, 174c2, and 174d1 are different, but other configurations and shapes are the same as each other. In FIGS. 5A to 5C, due to space circumstances, the first electrode 130d2, the piezoelectric body 140d2, and the second electrode 150d2, and the lead electrode of the piezoelectric element 110d2 (see FIG. 3) are not shown in the drawings.

The insulating layer 125 is formed on the substrate 120 and insulates the substrate 120 and the first electrodes 130c1, 130c2, and 130d1 from each other. The first electrodes 130c1, 130c2, and 130d1 are formed on the insulating layer 125. The piezoelectric bodies 140c1, 140c2, 140d1 are respectively formed on the first electrodes 130c1, 130c2, and 130d1. The second electrodes 150c1, 150c2, and 150d1 are respectively formed on the piezoelectric bodies 140c1, 140c2, and 140d1. The insulating layer 160 is formed on the first electrodes 130c1, 130c2, and 130d1 and the second electrodes 150c1, 150c2, and 150d1. The insulating layer 160 has openings (contact holes) on some parts thereof, so that the first lead electrodes 173c1, 173c2, and 173d1 respectively come in contact with the first electrodes 130c1, 130c2, and 130d1, and the second lead electrodes 174c1, 174c2, and 174d1 respectively come in contact with the second electrode 150. The first lead electrodes 173c1, 173c2, and 173d1 are formed on the insulating layer 160 and respectively come in contact with the first electrodes 130c1, 130c2, and 130d1. The second lead electrodes 174c1, 174c2, and 174d1 are formed on the insulating layer 160 and respectively come in contact with the second electrodes 150c1, 150c2, and 150d1. In the configuration shown in FIG. 5A, the lead electrodes 173c1, 173c2, 173d1, 174c1, 174c2, and 174d1 are not directly connected to each other. Instead of that, the first lead electrode 173c2 and the second lead electrode 174c1 are wired by the wiring 155c1. The second lead electrodes 174c1, 174c2, and 174d1 may extend to an area of the lower portion where the piezoelectric body 140 is not present. When the wiring is connected to the second lead electrodes 174c1, 174c2, and 174d1 in an area of the lower portion where the piezoelectric bodies 140c1, 140c2, 140d1 are not present, the electrostatic breakdown of the piezoelectric body 140 due to the connection of the wiring 155c1 hardly occurs.

In comparison with the piezoelectric vibrating body 100 of FIG. 5A, the piezoelectric vibrating body 100 of FIG. 5B has different points that the piezoelectric vibrating body does not include the first lead electrode 173c2 and the second lead electrode 174c1 extends until the second lead electrode comes in contact with the first electrode 130c2. In the piezoelectric vibrating body 100 shown in FIG. 5A, the first electrode 130c2 and the second electrode 150c1 are electrically connected to each other using the first lead electrode 173c2, the wiring 155c1, and the second lead electrode 174c1. With respect to this, in the piezoelectric vibrating body shown in FIG. 5B, the first electrode 130c2 and the second electrode 150c1 are electrically connected to each other using the second lead electrode 174c1 (wiring layer). In the piezoelectric vibrating body 100 shown in FIG. 5B, since the second electrode 150c2 and the first electrode 130d1 are not electrically connected to each other, the second lead electrode 174c2 does not extend to the first electrode 130d1 and the first lead electrode 173d1 is independently provided.

In comparison with the piezoelectric vibrating body 100 of FIG. 5A, the piezoelectric vibrating body 100 of FIG. 5C has a different point that the first lead electrodes 173c1, 173c2, and 173d1 and the second lead electrodes 174c1, 174c2, and 174d1 have a different shape. In the piezoelectric vibrating body 100 shown in FIG. 5C, the first lead electrodes 173c1, 173c2, and 173d1 extend to the upper portion of the second electrodes 150c1, 150c2, and 150d1. A height from the substrate 120 to the first lead electrodes 173c1, 173c2, and 173d1 on the piezoelectric bodies 140c1, 140c2, and 140d1 and a height from the substrate 120 to the second lead electrodes 174c1, 174c2, and 174d1 are substantially the same as each other. Accordingly, in the example shown in FIG. 5C, a plate-shaped member including a wiring layer is disposed on the first lead electrodes 173c1, 173c2, and 173d1 and the second lead electrodes 174c1, 174c2, and 174d1, and the first lead electrode 173c2 and the second lead electrode 174c1 can be connected to each other, using the wiring layer of the plate-shaped member, for example. In the same manner as the configuration of FIG. 5A, the configuration of FIG. 5C can also be used in the wiring implemented by the wiring 155c1. In FIG. 5C, the second lead electrodes 174c1, 174c2, and 174d1 are formed only on the piezoelectric bodies 140c1, 140c2, and 140d1, but the second lead electrodes may extend to an area of the lower portion where the piezoelectric body 140 is not present, in the same manner as the case of the second lead electrodes 174c1, 174c2, and 174d1 of FIG. 5A. The electrostatic breakdown of the piezoelectric body 140 due to the connection of the wiring 155c1 hardly occurs.

Figure 6:
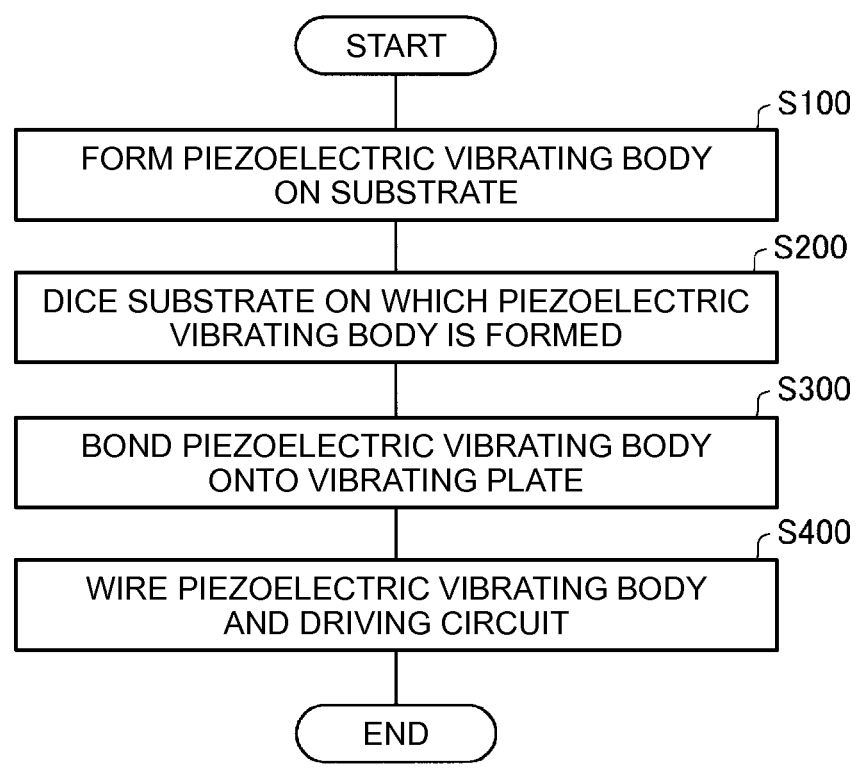
FIG. 6 is a flowchart showing manufacturing of the piezoelectric driving device.
Figure 7A:
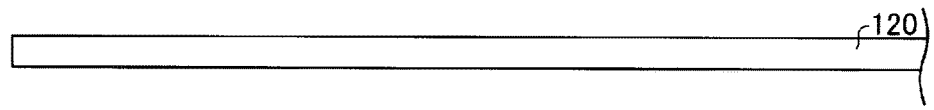
Figure 7A:
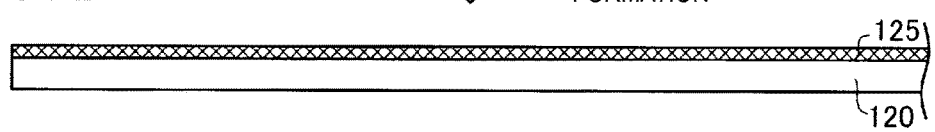
Figure 7A:
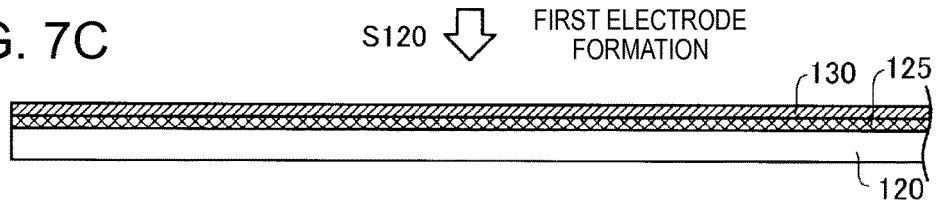
Figure 7A:
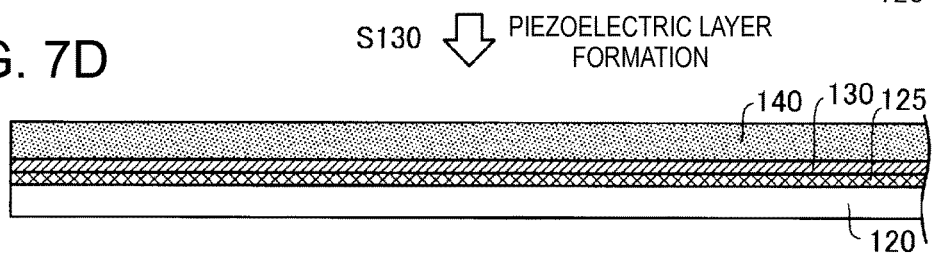
Figure 7A:
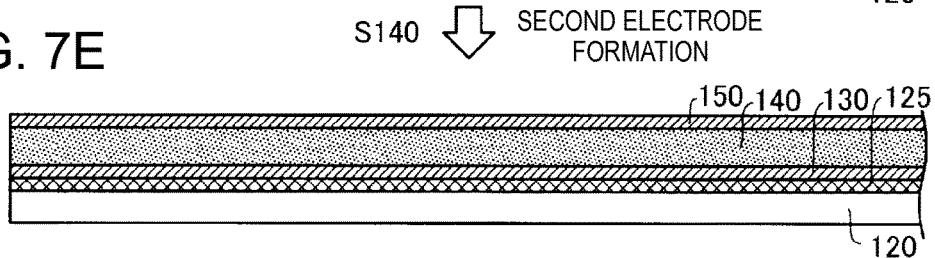
Figure 7A:
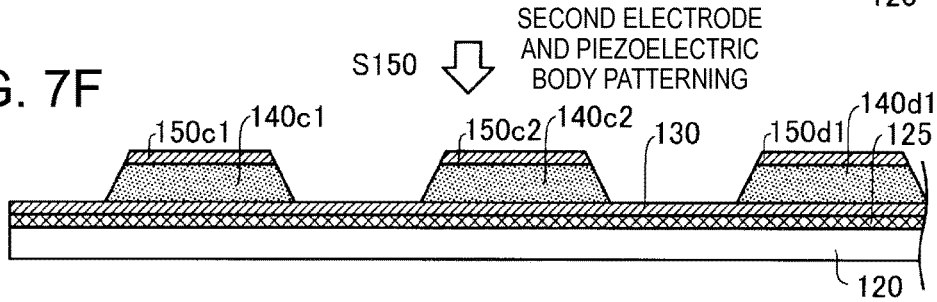
Figure 8F:
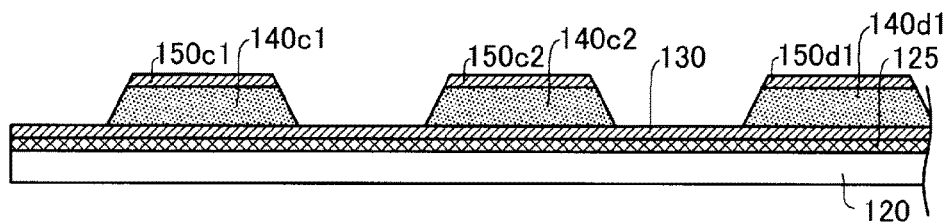
Figure 8F:
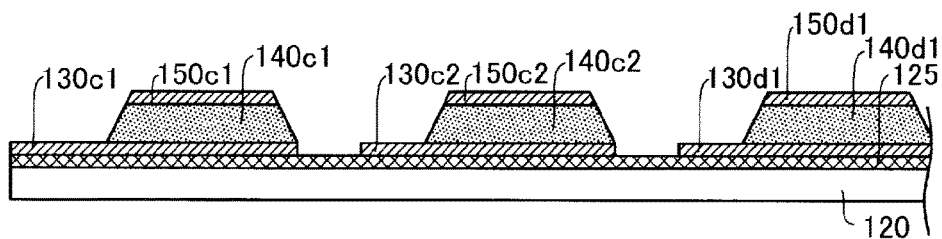
Figure 8F:
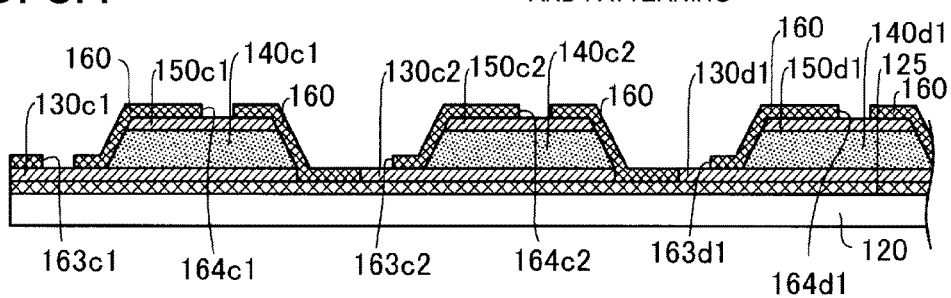
Figure 8F:
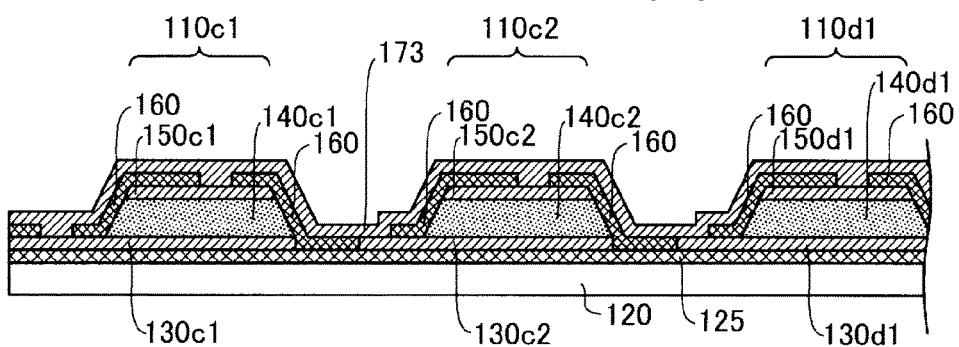

FIG. 6 is a flowchart showing manufacturing of the piezoelectric driving device 10. In Step S100, the piezoelectric elements 110 are formed on the substrate 120, and accordingly, the piezoelectric vibrating body 100 is formed. At that time, a Si wafer can be used, as the substrate 120, for example. The plurality of piezoelectric vibrating bodies 100 can be formed on one Si wafer. In addition, since Si has a great value of a mechanical quality factor Qm which is approximately 100,000, it is possible to increase the mechanical quality factor Qm of the piezoelectric vibrating body 100 or the piezoelectric driving device 10. In Step S200, the substrate 120 on which the piezoelectric vibrating body 100 is formed is diced and divided into each of the piezoelectric vibrating bodies 100. A rear surface of the substrate 120 may be ground before dicing the substrate 120 to have a desired thickness of the substrate 120. In Step S300, the two piezoelectric vibrating bodies 100 are bonded to both surfaces of the vibrating plate 200 with an adhesive. In Step S400, a wiring layer of the piezoelectric vibrating bodies 100 and the driving circuit are electrically connected to each other.

FIGS. 7A to 8I are explanatory diagrams showing a manufacturing process of the piezoelectric vibrating body 100 in Step S100 of FIG. 6. FIGS. 7A to 8I show a process of forming the piezoelectric elements 110c1, 110c2, and 110d1 shown on the upper right portion of FIG. 5 on the substrate 120. In Step S110 of FIGS. 7A to 7F, the substrate 120 is prepared and the insulating layer 125 is formed on the surface of the substrate 120. A SiO$_2$ layer which is formed by thermal oxidation of the surface of the substrate 120 can be used, for example, as the insulating layer 125. In addition, an organic material such as alumina (Al$_2$O$_3$), acryl or polyimide can be used as the insulating layer. When the substrate 120 is an insulator, a step of forming the insulating layer 125 can be omitted.

In Step S120, the first electrode 130 is formed on the insulating layer 125. The first electrode 130 can be formed by sputtering, for example. In this stage, the first electrode 130 may not be patterned to be divided into a plurality of pieces.

In Step S130, the piezoelectric body 140 is formed on the first electrode 130. Specifically, the piezoelectric body 140 can be formed using a sol-gel method, for example. That is, a sol-gel solution which is a piezoelectric body material is added dropwise onto the substrate 120 (first electrode 130), high-speed rotation of the substrate 120 is performed, and accordingly, a thin film of the sol-gel solution is formed on the first electrode 130. Then, the thin film is calcined at a temperature of 200° C. to 300° C. to form a first layer of the piezoelectric body material on the first electrode 130. After that, by repeating the cycle of the dropping of the sol-gel solution, the rapid-speed rotation, and the calcination several times, a piezoelectric layer having a desired thickness is formed on the first electrode 130. A thickness of one layer of the piezoelectric body formed in one cycle depends on the viscosity of the sol-gel solution or a rotation rate of the substrate 120, and is approximately from 50 nm to 150 nm. After forming the piezoelectric layer having a desired thickness, the piezoelectric layer is sintered at a temperature of 600° C. to 1,000° C. to form the piezoelectric body 140. When the thickness of the piezoelectric body 140 after sintering is set to be from 50 nm (0.05 μm) to 20 μm, it is possible to implement the miniaturized piezoelectric driving device 10. When the thickness of the piezoelectric body 140 is set to be equal to or greater than 0.05 μm, it is possible to generate a sufficiently great enough force according to the expansion and contraction of the piezoelectric body 140. When the thickness of the piezoelectric body 140 is set to be equal to or smaller than 20 μm, it is possible to generate a sufficiently great enough force, even when a voltage to be applied to the piezoelectric body 140 is equal to or smaller than 600 V. As a result, it is possible to configure the driving circuit 300 for driving the piezoelectric driving device 10 with an inexpensive element. The thickness of the piezoelectric body may be equal to or greater than 400 nm and in this case, it is possible to increase an amount of force generated by the piezoelectric element. The temperature or time of calcining or sintering is merely an example and is appropriately selected depending on the piezoelectric body material.

When the thin film of the piezoelectric body material is formed and sintered using a sol-gel method, (a) a thin film is easily formed, (b) crystallization is easily performed in a grating direction, and (c) withstanding pressure of the piezoelectric body can be improved, when compared to a sintering method of the related art of mixing and sintering raw material powder.

In Step S140, the second electrode 150 is formed on the piezoelectric body 140. In the same manner as in the case of the first electrode, the formation of the second electrode 150 can be performed by sputtering.

In Step S150, the second electrode 150 and the piezoelectric body 140 are patterned and the second electrodes 150c1, 150c2, and 150d1 and the piezoelectric bodies 140c1, 140c2, and 140d1 are formed. In the embodiment, by performing ion milling using an argon ion beam, the patterning of the second electrode 150 and the piezoelectric body 140 is performed. By controlling the time of ion milling, only the second electrode 150 and the piezoelectric body 140 may be patterned and the first electrode 130 may not be patterned. Instead of performing the patterning using ion milling, the patterning may be performed by other arbitrary patterning methods (for example, dry etching using chlorinated gas).

In Step S160 of FIGS. 8F to 8I, the first electrode 130 is patterned and the first electrodes 130c1, 130c2, and 130d1 are formed. Since a mask used in Step S160 and a mask used in Step S150 are different from each other, the steps are described as separate steps in the embodiment.

In Step S170, the insulating layer 160 is formed on the first electrodes 130c1, 130c2, and 130d1 and the second electrodes 150c1, 150c2, and 150d1. As the insulating layer 160, a phosphorous-containing silicon oxide film (PSG film), a boron.phosphorous-containing silicon oxide film (BPSG film), a silicon oxide film not containing impurities such as boron or phosphorous (NSG film), or a silicon nitride film ($Si_3N_4$ film) can be used. The insulating layer 160 can be formed by a CVD method, for example. After forming the insulating layer 160, patterning is performed for forming contact holes 163c1, 163c2, 163d1, 164c1, 164c2, and 164d1 of the first electrodes 130c1, 130c2, and 130d1 and the second electrodes 150c1, 150c2, and 150d1.

In Step S180, a conductor layer 170 for a lead electrode is formed. The conductor layer 170 can be formed using aluminum, for example, and is formed by sputtering.

After that, by patterning the conductor layer 170, the first lead electrodes 173c1, 173c2, and 173d1 and the second lead electrodes 174c1, 174c2, and 174d1 are formed. The shape of the mask used in patterning can also be used for any shape in FIGS. 5A to 5C.

After that, although not shown, a passivation film is formed on the first lead electrode 171 and the second lead electrode 172. A passivation film can be formed using SiN or polyimide, for example. Openings (contact holes) for connecting the first lead electrodes 173c1, 173c2, and 173d1 and the second lead electrodes 174c1, 174c2, and 174d1 to the wirings 151, 152, 310, 312, 314, 320, 322, 324, and 155c1 (FIG. 3) are formed on the passivation film.

Hereinabove, according to the embodiment, since the four piezoelectric elements are connected in series, the composite capacitance of the piezoelectric element of the piezoelectric driving device 10 can be decreased by 1/16. Although not described regarding a driving voltage, when the four piezoelectric elements are connected in series and the applied voltage is increased by four times, the magnitude of the voltage applied to one piezoelectric element can be set to be the same.

According to the embodiment, the piezoelectric elements have substantially the same size and have substantially the same capacitance. Accordingly, the magnitude of the voltage applied to each piezoelectric element when the piezoelectric elements are connected in series, is substantially the same. Since there is no piezoelectric element to which a higher voltage is applied, compared to other piezoelectric elements, durability for the entirety of elements can be improved.

According to the embodiment, since the substrate 120 is provided between the plurality of first electrodes 130 and the vibrating plate 200, it is possible to increase a value of the mechanical quality factor Qm of the piezoelectric driving device 10, compared to a case where there is no substrate 120.

When the piezoelectric elements are connected in series as in the embodiment, the number of wirings is decreased, compared to a case where the piezoelectric elements are connected in parallel, and accordingly, it is possible to decrease resistance due to wiring. In addition, it is possible to decrease constraint of deformation of the piezoelectric elements or leakage of vibration energy. Therefore, stabilized vibration with a great amplitude is obtained, and it is possible to implement the piezoelectric driving device 10 having excellent efficiency.

When the driving voltage is applied, the undulating voltage may be applied so that directions of polarization of the plurality of piezoelectric elements 110 are the same direction. Since a direction of polarization of the piezoelectric body of the piezoelectric vibrating body 100 during the operation is not inversed, it is possible to improve durability of the piezoelectric elements 110. The direction of polarization may be a direction from the second electrode to the first electrode.

As shown in FIGS. 5A to 5C, the connection between the first electrode 130c2 and the second electrode 150c1 may be performed using the wire-shaped wiring 155c1 or may be performed using the second lead electrode 174c1. When performing the connection using the wire-shaped wiring, it is possible to comparatively freely change the connection between the first electrode and the second electrode of the piezoelectric element. When using the second lead electrode 174c1, disconnection hardly occurs.

Modification Example 1 of First Embodiment

In the above description, an example in which the piezoelectric element of each of piezoelectric element groups 110a, 110b, 110c, and 110d is divided into two pieces, the piezoelectric element of the piezoelectric element group 110e is divided into four pieces, and the four piezoelectric elements are connected in series, has been described, but the number of the divided pieces of the piezoelectric element of each of piezoelectric element groups 110a, 110b, 110c, and 110d may be N (N is an integer equal to or larger than 2). In this case, the piezoelectric element of the piezoelectric element group 110e may be divided into 2N pieces. When the piezoelectric element of each of piezoelectric element groups 110a, 110b, 110c, and 110d is divided into N pieces, the composite capacitance is decreased by $1/(2N)^2$.

Modification Example 2 of First Embodiment

Figure 9A:
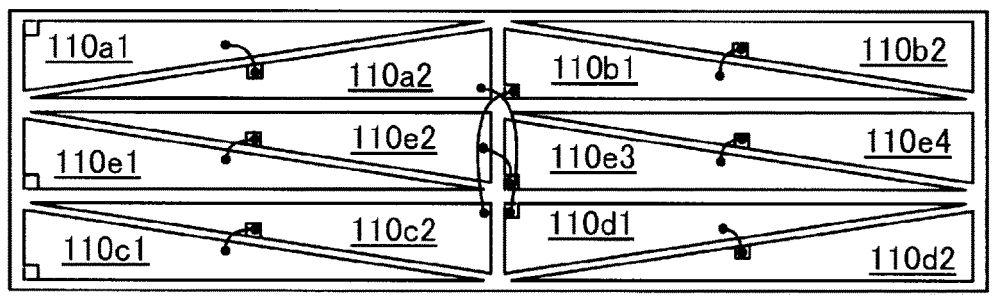
FIGS. 9A to 9C are explanatory diagrams showing variation examples of a shape and disposition of piezoelectric elements.
Figure 9B:
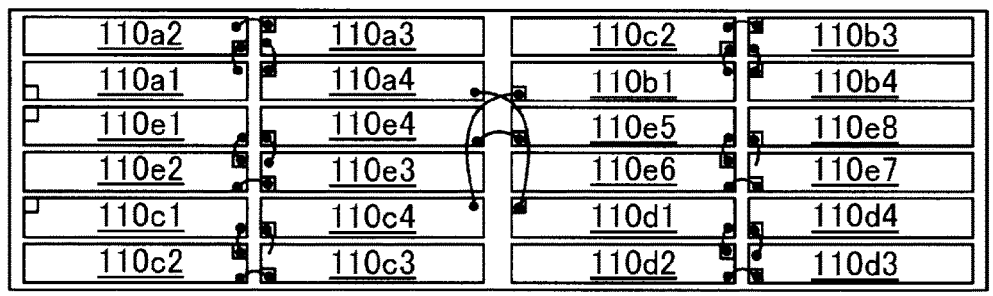
Figure 9C:
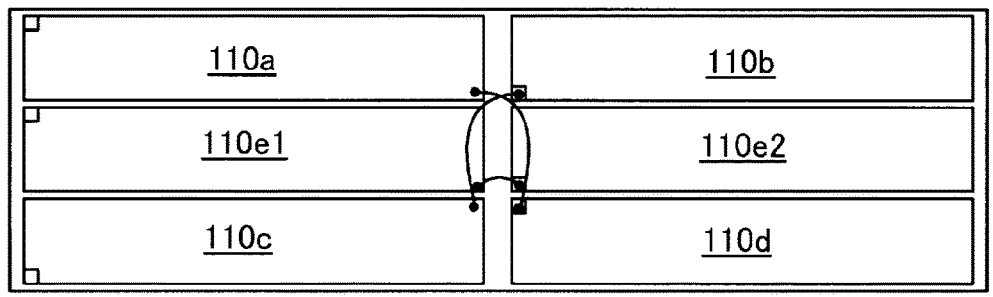

FIGS. 9A to 9C are explanatory diagrams showing variation examples of the shape and disposition of piezoelectric elements. An example shown in FIG. 9A is different from that of the first embodiment shown in FIGS. 1A and 1B, in that the planar shape of each piezoelectric element 110 is a triangular shape. However, even when the planar shape of the piezoelectric element 110 is different, the capacitance is substantially the same, when areas of the overlapping part of the two electrodes of the piezoelectric element are the same. Accordingly, even in the example shown in FIG. 9A, it is possible to decrease the composite capacitance, in the same manner as in the first embodiment.

In an example shown in FIG. 9B, eight piezoelectric elements 110 are divided to have smaller pieces, compared to the case in the first embodiment shown in FIGS. 1A and 1B. In the first embodiment shown in FIGS. 1A and 1B, the piezoelectric elements 110e1 to 110e4 are disposed in a straight line along the longitudinal direction, but in an example shown in FIG. 9B, the piezoelectric elements are disposed in zigzags along the longitudinal direction. Even when the piezoelectric elements are disposed as described above, the composite capacitance does not change. As shown in FIGS. 9A and 9B, when the plurality of piezoelectric elements are connected in series, the planar shape of the piezoelectric elements or the disposed position thereof is freely set.

In an example shown in FIG. 9C, only the piezoelectric element of the piezoelectric element group 110e is divided into two of the piezoelectric elements 110e1 and 110e2, and the piezoelectric element of the other piezoelectric element groups 110a, 110b, 110c, and 110d is not divided. The piezoelectric elements 110a and 110d are connected in series, the piezoelectric elements 110c and 110b are connected in series, and the piezoelectric elements 110e1 and 110e2 are connected in series. With such connection configurations, the composite capacitance can be decreased by ¼, compared to that disclosed in JP-A-2004-320979.

Modification Example 3 of First Embodiment

Figure 10:
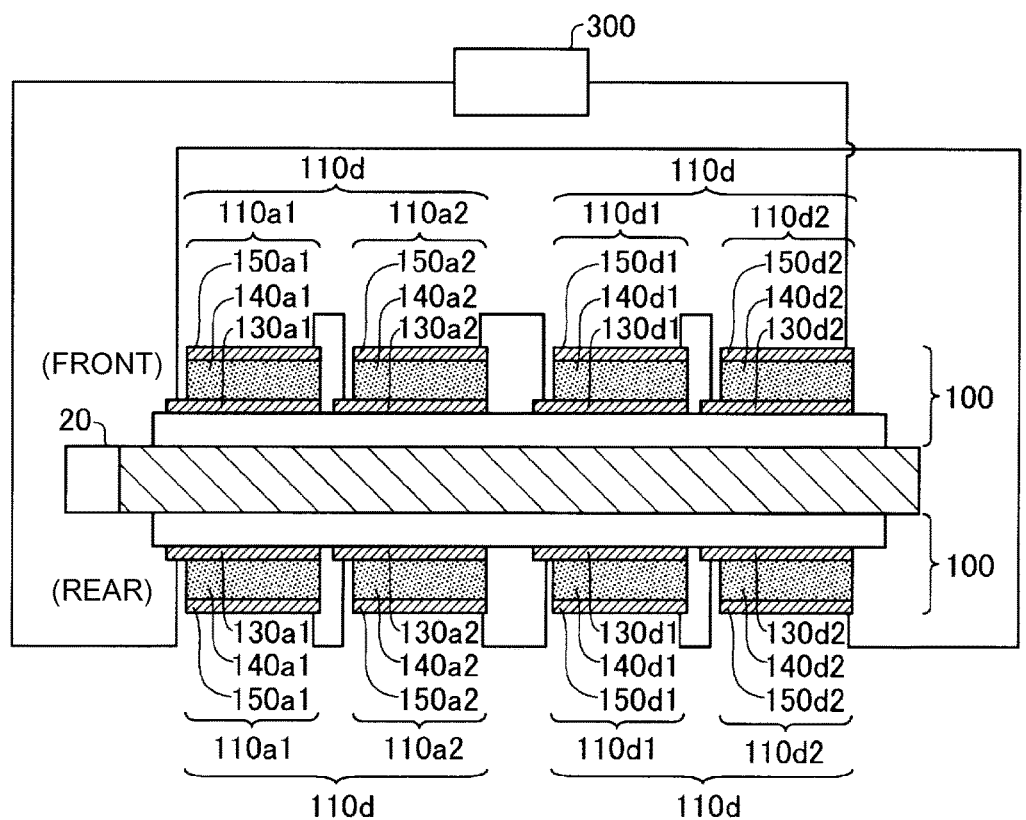
FIG. 10 is an explanatory diagram showing a piezoelectric driving device according to a modification example of the first embodiment.

FIG. 10 is an explanatory diagram showing the piezoelectric driving device 10 according to a modification example of the first embodiment and is a view corresponding to FIG. 1B. In the piezoelectric driving device 10 of the modification example shown in FIG. 10, the piezoelectric vibrating bodies 100 are disposed on both surfaces of the vibrating plate 200 and the piezoelectric element 110 on the front surface of the piezoelectric vibrating body 100 and the piezoelectric element 110 on the rear surface of the piezoelectric vibrating body 100 are connected in series. By doing so, it is possible to further halve an amount of the capacitance of the piezoelectric driving device 10.

Second Embodiment

Figure 11:
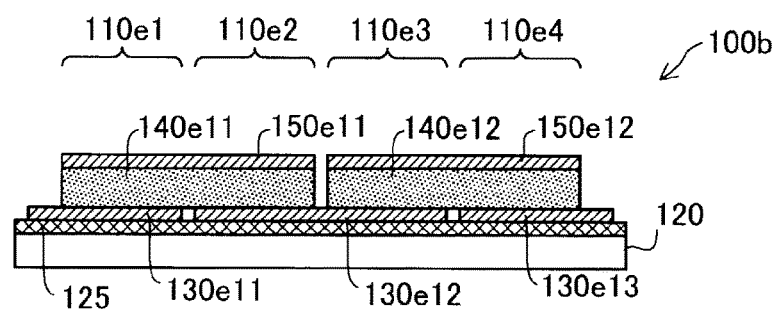
FIG. 11 is an explanatory diagram showing a section of a piezoelectric driving body of a piezoelectric driving device according to a second embodiment.
Figure 12C:
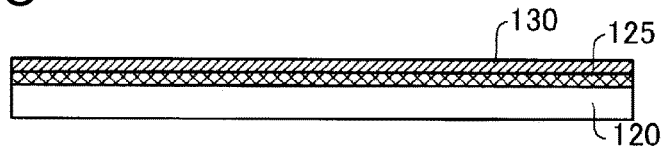
FIGS. 12C to 12H are explanatory diagrams schematically showing a manufacturing step of a piezoelectric element used in the piezoelectric driving device of the second embodiment.
Figure 12D:
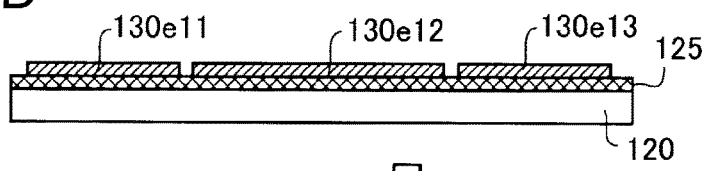
Figure 12E:
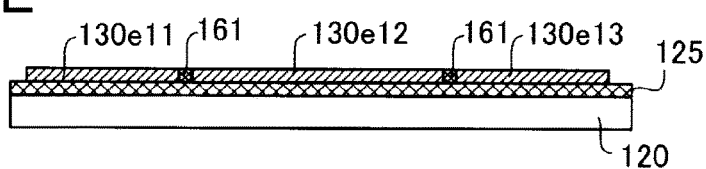
Figure 12F:
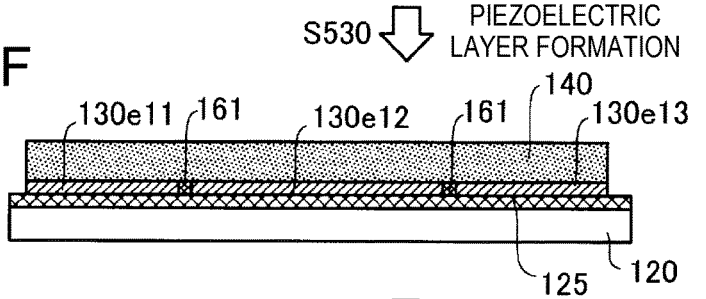
Figure 12G:
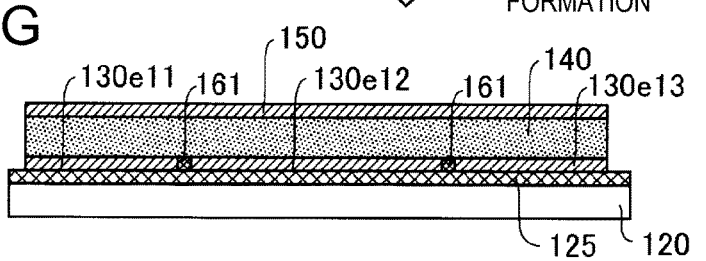
Figure 12H:
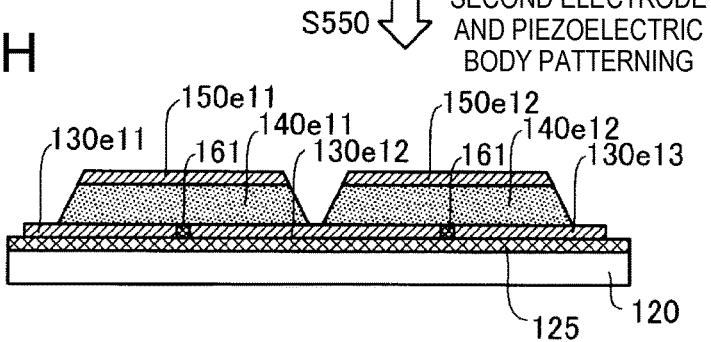

FIG. 11 is an explanatory diagram showing a section of a piezoelectric driving body 100b of a piezoelectric driving device according to a second embodiment. FIG. 11 shows a laminated structure which is different from that of the embodiment shown in FIGS. 1A and 1B, regarding the piezoelectric elements 110e1 to 110e4 of the third group shown in FIGS. 1A and 1B. In the second embodiment, three first electrodes 130e11 to 130e13, two piezoelectric bodies 140e11 and 140e12, and two second electrodes 150e11 and 150e12 are included. The piezoelectric element 110e1 is formed with the first electrode 130e11 and a part of the piezoelectric body 140e11 (portion overlapping with the first electrode 130e11) and a part of the second electrode 150e11 (portion overlapping with the first electrode 130e11). The piezoelectric element 110e2 is formed with a part of the first electrode 130e12 (portion overlapping with the second electrode 150e11), a part of the piezoelectric body 140e11 (portion overlapping with the first electrode 130e12), and a part of the second electrode 150e11 (portion overlapping with the first electrode 130e12). That is, the first electrode of the first piezoelectric element 110e1 and the first electrode of the second piezoelectric element 110e2 form one continuous first electrode 130e11, and the second electrode of the second piezoelectric element 110e2 and the second electrode of the third piezoelectric element 110e3 form one continuous second electrode 150e11. The piezoelectric element 110e3 is formed, in the same manner as described above. In FIG. 11, the piezoelectric body 140 is divided into a plurality of pieces (140e11 and 140e12), but the piezoelectric body 140 may not be divided and may be connected.

FIGS. 12C to 12H are explanatory diagrams schematically showing a manufacturing step of the piezoelectric vibrating body used in the piezoelectric driving device of the second embodiment. The same steps described in FIGS. 7A to 7H are performed to obtain a state of FIG. 12C, and therefore the subsequent steps will be described.

In Step S510, the first electrode 130 is patterned and divided into the first electrodes 130e11, 130e12, and 130e13. This patterning can be performed by performing ion milling using argon gas or dry etching using chlorinated gas.

In Step S520, an insulating layer 161 is formed and patterned to fill the gap between the first electrodes 130e11 and 130e12 and the gap between the first electrodes 130e12 and 130e13 and have flattened surfaces. In Step S530, the piezoelectric body 140 is formed on the first electrodes 130e11, 130e12, and 130e13 and in Step S540, the second electrode 150 is formed on the piezoelectric body 140. In Step S550, the second electrode 150 and the piezoelectric body 140 are patterned. Since Steps S530, S540, and S550 can be executed with the same processes as those in Steps S130, S140, and S150 of FIGS. 7A to 7H, the description thereof will be omitted. In FIGS. 7A to 7H, the formation and patterning of the insulating layer 160 and the formation of the lead electrode are performed after that, and in the embodiment, the formation and patterning of the insulating layer 160 and the formation of the lead electrode are performed in the same manner. This description becomes the repetition of the same description, and therefore the description thereof will be omitted.

The capacitance of the piezoelectric element 110e1 is proportional to the area of the overlapping portion of the first electrode 130e11 and the second electrode 150e11. According to the second embodiment, since the area of the overlapping portion of the first electrode 130e11 and the second electrode 150e11 is smaller than the overlapping area of the first electrode and the second electrode of the related art, it is possible to decrease the capacitance, in the same manner as in the first embodiment. The piezoelectric element 110e1 and the piezoelectric element 110e2 are connected in series by the second electrode 150e11, and the piezoelectric element 110e2 and the piezoelectric element 110e3 are connected in series by the first electrode 130e12. Accordingly, it is possible to decrease an amount of the composite capacitance with the effect of series connection.

According to the second embodiment, it is possible to perform the series connection of the piezoelectric elements, without using the wire-shaped wiring or the lead electrode.

Third Embodiment

Figure 13:
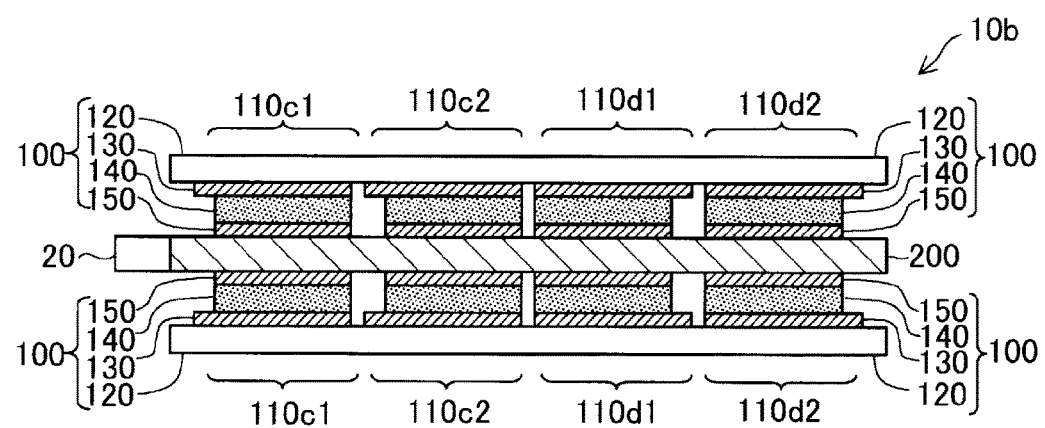
FIG. 13 is a sectional view of a piezoelectric driving device as a third embodiment of the invention.

FIG. 13 is a sectional view of a piezoelectric driving device 10b as a third embodiment of the invention and is a view corresponding to FIG. 1B of the first embodiment. In the piezoelectric driving device 10b, the piezoelectric vibrating body 100 is disposed on the vibrating plate 200 in an upside down state of the state of FIG. 1B. That is, herein, the second electrodes 150c1, 150c2, 150d1, and 150d2 are close to the vibrating plate 200 and the substrate 120 is disposed to be farthest from the vibrating plate 200. Also in FIG. 13, first electrodes 130a1, 130a2, 130b1, 130b2, 130c1, 130c2, 130d1, 130d2, 130e1, 130e2, 130e3, and 130e4, second electrodes 150a1, 150a2, 150b1, 150b2, 150c1, 150c2, 150d1, 150d2, 150e1, 150e2, 150e3, and 150e4, and wiring for electrical connection with the driving circuit (or a wiring layer or an insulating layer) are omitted in the drawing, in the same manner as in FIG. 1B. The piezoelectric driving device 10b can also achieve the same effects as those in the first embodiment.

FIGS. 14A to 14E are explanatory diagrams showing a manufacturing step of the piezoelectric driving device 10b shown in FIG. 13. In Step S610, a vibrating plate 200 is prepared and an insulating layer 202 is formed. The insulating layer 202 can be formed using an insulating resin such as polyimide, for example. In Step S620, a wiring layer 204 is formed on the insulating layer 202 and the wiring layer 204 is patterned. The wiring layer 204 includes a wiring for connecting the first electrode and the second electrode in series or a wiring for connecting the piezoelectric element to the driving circuit. As the wiring layer 204, copper or aluminum can be used. In Step S630, an insulating layer 206 is formed on the wiring layer 204 and openings are patterned. The insulating layer 206 can be formed using solder resist, for example.

Figure 14A:
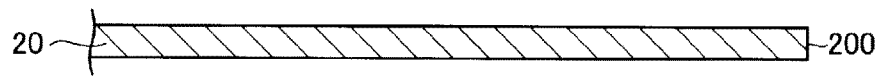
FIGS. 14A to 14E are explanatory diagrams showing a manufacturing step of the piezoelectric driving device shown in FIG. 13.
Figure 14B:
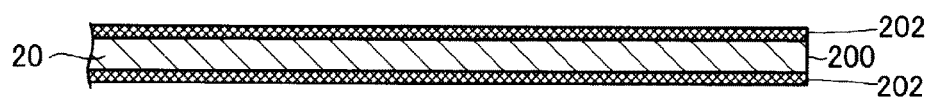
Figure 14C:
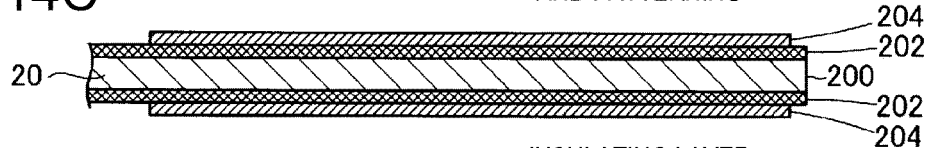
Figure 14D:
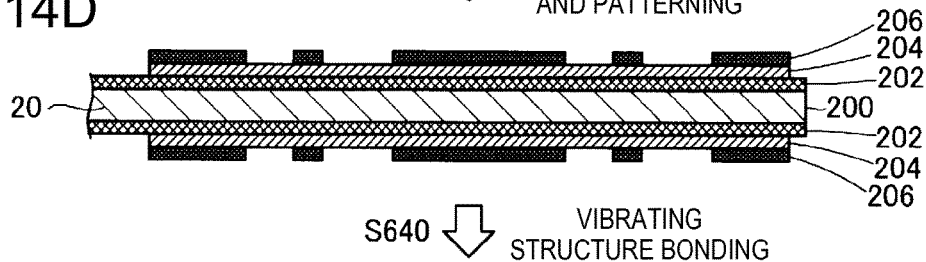
Figure 14E:
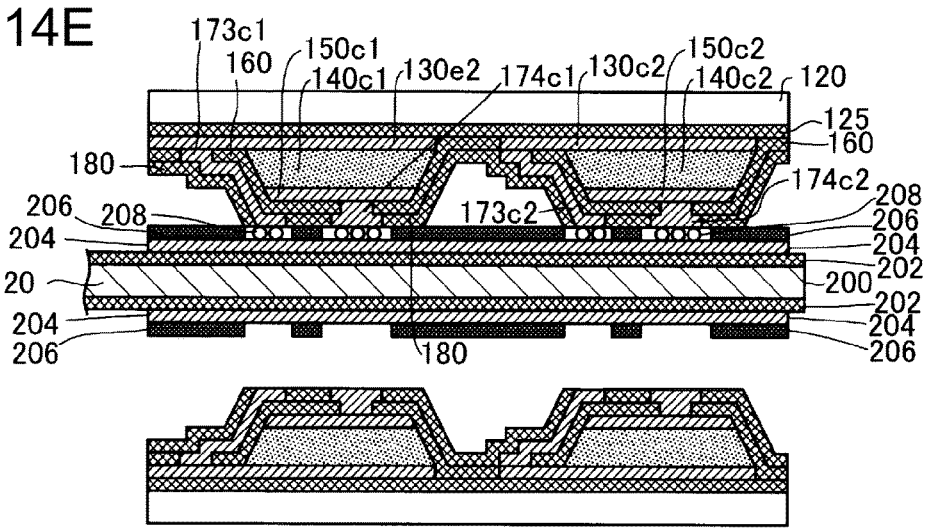

In Step S640, the piezoelectric vibrating body 100 (FIG. 5C) manufactured by performing the processes of FIGS. 6A to 7F is bonded to both surfaces of the vibrating plate 200. At that time, a conductive member 208 is disposed between the wiring layer 204 and the first lead electrodes 173c1 and 173c2 and the second lead electrodes 174c1 and 174c2 and the wiring layer and the first and second lead electrodes electrically come in contact with each other through the conductive member 208. Even when there are some differences in level between the wiring layer 204 of the vibrating plate 200 and the first lead electrodes 173c1 and 173c2 and the second lead electrodes 174c1 and 174c2 of the piezoelectric vibrating body 100, the differences in level are alleviated through the conductive member 208 and the wiring layer and the first and second lead electrodes electrically come in contact with each other. As the conductive member 208, microbumps or conductive paste can be used, for example. A first surface side of FIG. 14E shows a state where the piezoelectric vibrating body 100 is bonded and a second surface side thereof shows a state immediately before the piezoelectric vibrating body 100 is bonded. The passivation film 180 described above is formed on the upper portion of the piezoelectric vibrating body 100 shown in FIG. 14E. The passivation film 180 protects the circumference of the first lead electrodes 173c1 and 173c2 and the second lead electrodes 174c1 and 174c2 and prevents an electrical short circuit between the first lead electrodes 173c1 and 173c2 and the second lead electrodes 174c1 and 174c2 and another member. In the embodiment, the shape of the second lead electrodes 174c1 and 174c2 is not extended to an area of the lower portion where the piezoelectric body 140 is not present. This is because the second lead electrodes are connected to the wiring layer 204 of the vibrating plate 200 through the conductive member 208, and accordingly, it is not necessary for the second lead electrodes 174c1 and 174c2 to extend to the area of the lower portion where the piezoelectric body 140 is not present. However, the second lead electrodes 174c1 and 174c2 may extend to the area of the lower portion where the piezoelectric body 140 is not present.

After that, the wiring layer 204 and the driving circuit 300 (FIG. 8) are connected to each other using the wirings 310, 312, 314, 320, 322, and 324. That is, in the embodiment, the direct wiring is not performed on the first lead electrodes 173c1 and 173c2 and the second lead electrodes 174c1 and 174c2 using the wirings 310, 312, 314, 320, 322, and 324, but the wiring is performed through the wiring layer 204. Accordingly, the direct wiring may not be performed on the piezoelectric vibrating body 100 being vibrated, or even when the piezoelectric vibrating body 100 is vibrated, wiring is hardly disconnected. In the embodiment, the wirings 310, 312, 314, 320, 322, and 324 are connected after bonding the piezoelectric vibrating body 100 to the vibrating plate 200, but the wirings 310, 312, 314, 320, 322, and 324 may be connected to the piezoelectric vibrating body 100 first, and then the piezoelectric vibrating body 100 may be bonded to the vibrating plate 200.

Embodiment of Apparatus Using Piezoelectric Driving Device

The piezoelectric driving device 10 described above can apply great force to a body to be driven by using resonance, and can be applied to various apparatuses. The piezoelectric driving device 10 can be used as a driving device in various apparatuses such as a robot (including an electronic component conveying apparatus (IC handler)), a pump for medication, a calendar transporting apparatus of a clock, and a printing apparatus (for example, a paper feeding mechanism, however, a vibrating plate is not resonated in a piezoelectric driving device used in a head, and accordingly, the piezoelectric driving device is not applied to a head), for example. Hereinafter, a representative embodiment will be described.

Figure 15:
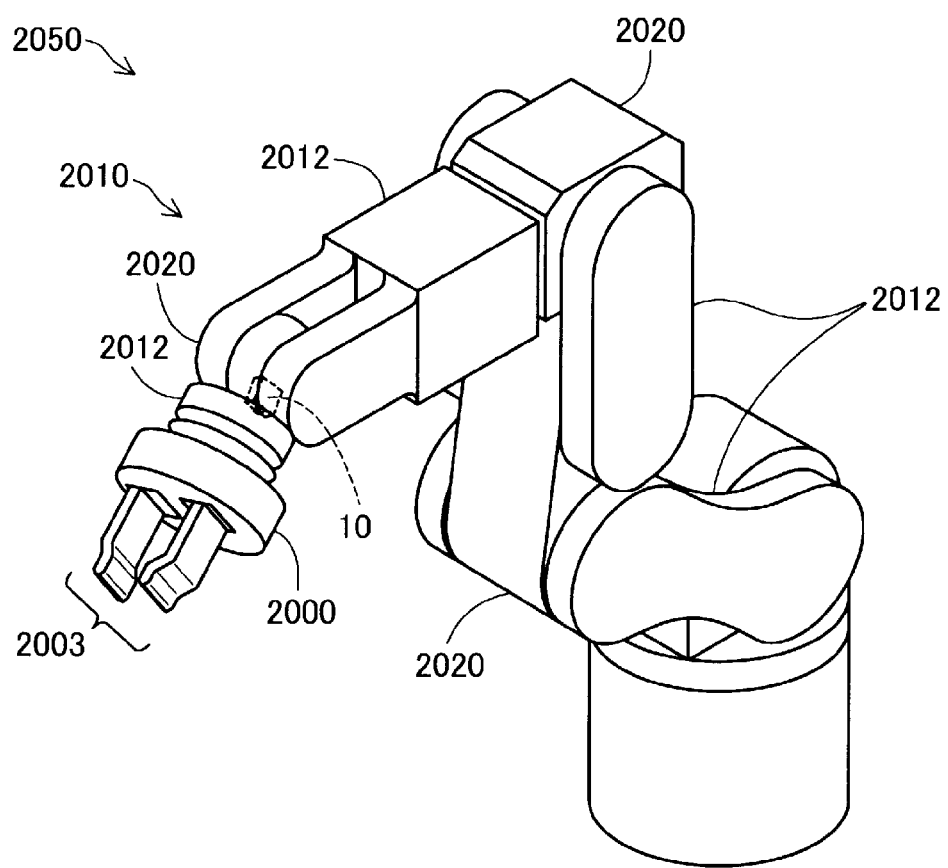
FIG. 15 is an explanatory diagram showing an example of a robot using a piezoelectric driving device.

FIG. 15 is an explanatory diagram showing an example of a robot 2050 using the piezoelectric driving device 10 described above. The robot 2050 includes an arm 2010 (also referred to as an "arm portion") which includes a plurality of linking portions 2012 (also referred to as "linking members") and a plurality of joints 2020 which are connected between the linking portions 2012 to be rotated or curved. The piezoelectric driving device 10 described above is embedded in each joint 2020, and it is possible to rotate or curve the joint 2020 by an arbitrary angle using the piezoelectric driving device 10. A robot hand 2000 is connected to an end of the arm 2010. The robot hand 2000 includes a pair of grasping portions 2003. The piezoelectric driving device 10 is also embedded in the robot hand 2000, and it is possible to open and close the grasping portions 2003 using the piezoelectric driving device 10 to grasp an object. In addition, the piezoelectric driving device 10 is also provided between the robot hand 2000 and the arm 2010, and it is possible to rotate the robot hand 2000 with respect to the arm 2010 using the piezoelectric driving device 10.

Figure 16:
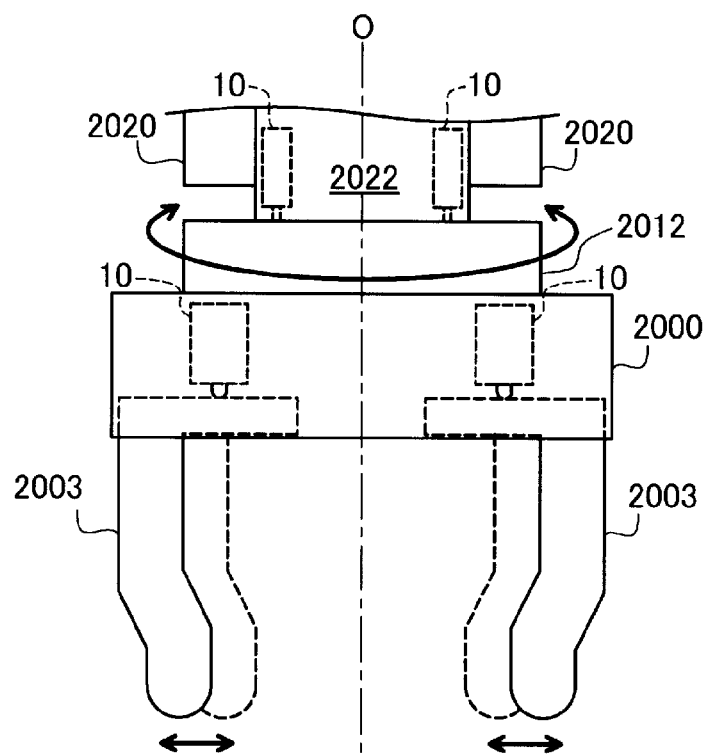
FIG. 16 is an explanatory diagram of a wrist part of a robot.

FIG. 16 is an explanatory diagram of a wrist part of the robot 2050 shown in FIG. 15. The wrist joints 2020 interpose a wrist rotation portion 2022 and a wrist linking portion 2012 is attached to the wrist rotation portion 2022 to be rotated around a center axis O of the wrist rotation portion 2022. The wrist rotation portion 2022 includes the piezoelectric driving device 10, and the piezoelectric driving device 10 rotates the wrist linking portion 2012 and the robot hand 2000 around the center axis O. The plurality of grasping portions 2003 are provided to stand on the robot hand 2000. A proximal end portion of the grasping portion 2003 can move in the robot hand 2000 and the piezoelectric driving device 10 is mounted in a base portion of this grasping portion 2003. Accordingly, by operating the piezoelectric driving device 10, it is possible to grasp a target by moving the grasping portion 2003.

In the embodiment shown in FIG. 16, the wrist linking portion 2012 and the robot hand 2000 are rotated around the center axis O using the two piezoelectric driving devices 10 (vibrating plate). In this case, the two piezoelectric driving devices 10 may be connected in series. Effects of a current decrease and wiring omission are obtained. In each piezoelectric driving device 10 to be connected in series, a plurality of piezoelectric elements may be connected in series or in parallel.

The robot is not limited to a single arm robot, and the piezoelectric driving device 10 can also be applied to a multi-arm robot having two or more arms. Herein, in addition to the piezoelectric driving device 10, an electric power line for applying power to various devices such as a force sensor or a gyro sensor or a signal line for transmitting signals to the devices is included in the wrist joints 2020 or the robot hand 2000, and an extremely large number of wirings are necessary. Accordingly, it was extremely difficult to dispose wirings in the joints 2020 or the robot hand 2000. However, since the piezoelectric driving device 10 of the embodiment described above can decrease a driving current, compared to a general electric motor or a piezoelectric driving device of the related art, it is possible to dispose wirings even in a small space such as the joint 2020 (particularly, a joint on the edge of the arm 2010) or the robot hand 2000.

Figure 17:
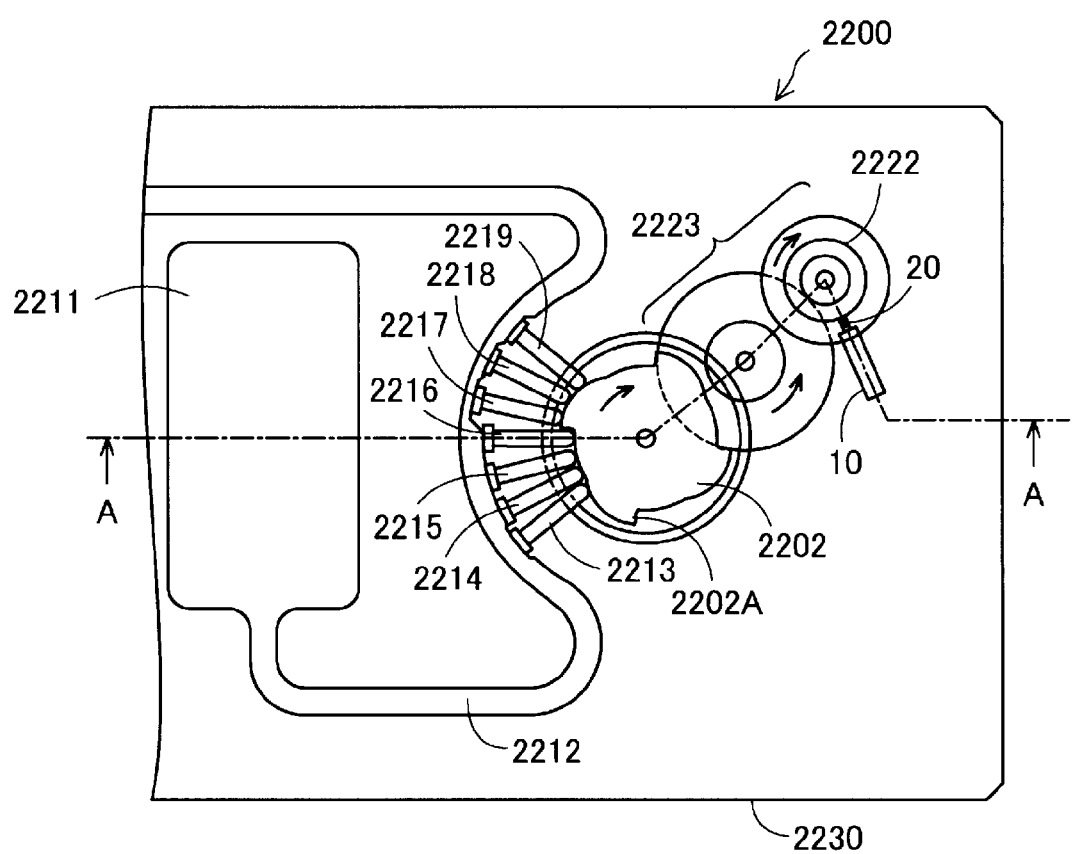
FIG. 17 is an explanatory diagram showing an example of a liquid feeding pump using the piezoelectric driving device.

FIG. 17 is an explanatory diagram showing an example of a liquid feeding pump 2200 using the piezoelectric driving device 10 described above. The liquid feeding pump 2200 includes a reservoir 2211, a tube 2212, the piezoelectric driving device 10, a rotor 2222, a deceleration transmission mechanism 2223, a cam 2202, and a plurality of fingers 2213, 2214, 2215, 2216, 2217, 2218, and 2219, in a case 2230. The reservoir 2211 is an accommodation portion which accommodates liquid which is a transportation target. The tube 2212 is a tube which transports the liquid sent from the reservoir 2211. A protrusion 20 of the piezoelectric driving device 10 is provided in a state of being pressed against a side surface of the rotor 2222 and the piezoelectric driving device 10 rotates the rotor 2222. A rotation force of the rotor 2222 is transmitted to the cam 2202 through the deceleration transmission mechanism 2223. The fingers 2213 to 2219 are members which block the tube 2212. When the cam 2202 is rotated, the fingers 2213 to 2219 are pressed to the outer side in an emission direction in order, by a protrusion 2202A of the cam 2202. The fingers 2213 to 2219 block the tube 2212 in order from the upstream side in a transportation direction (reservoir 2211 side). Accordingly, the liquid in the tube 2212 is transmitted to the downstream side in order. By doing so, it is possible to accurately feed an extremely small amount of liquid and to implement a small liquid feeding pump 2200. The disposition of each member is not limited to that shown in the drawing. The members such as fingers or the like may not be provided and a ball or the like provided on the rotor 2222 may block the tube 2212. The liquid feeding pump 2200 described above can be used as a dosing apparatus which gives medication such as insulin to a human body. Herein, by using the piezoelectric driving device 10 of the embodiment described above, a driving current is decreased, compared to a case of the piezoelectric driving device of the related art, and accordingly, it is possible to decrease power consumption of the dosing apparatus. Accordingly, when the dosing apparatus is driven with a battery, the effects are particularly effective.

Modification Examples

The invention is not limited to the examples or embodiments described above and can be implemented in various forms within a range not departing from a gist thereof, and the following modifications can also be performed, for example.

Modification Example 1

In the embodiment, the first electrode 130, the piezoelectric body 140, and the second electrode 150 are formed on the substrate 120, but the substrate 120 may be omitted and the first electrode 130, the piezoelectric body 140, and the second electrode 150 may be formed on the vibrating plate 200.

Modification Example 2

In the embodiment, one piezoelectric vibrating body 100 is provided on both surfaces of the vibrating plate 200, but one of the piezoelectric vibrating bodies 100 can be omitted. However, it is preferable to provide the piezoelectric vibrating body 100 on both surfaces of the vibrating plate 200, because the vibrating plate 200 can be deformed in a meander shape to be curved in the plane thereof.

Hereinabove, the embodiments of the invention have been described based on some examples, but the embodiments of the invention are for easy understanding of the invention and not for limiting the invention. The invention can include modifications, improvement, and equivalents to the invention, without departing from a gist and a scope of the aspects.

The entire disclosure of Japanese Patent Application No. 2014-164620, filed Aug. 13, 2014 is expressly incorporated by reference herein.

What is claimed is:

1. A piezoelectric driving device comprising:
a vibrating plate including a first surface and a second surface; and
a piezoelectric vibrating body which includes a plurality of piezoelectric elements including first and second piezoelectric elements, each of the plurality of piezoelectric elements being formed of a first electrode, a second electrode, and a piezoelectric member positioned between the first electrode and the second electrode, and the plurality of piezoelectric elements being disposed on at least one of the first surface and the second surface of the vibrating plate,
wherein the first and second piezoelectric elements are connected in series by the second electrode of the first piezoelectric element being connected to the first electrode of the second piezoelectric element.

2. The piezoelectric driving device according to claim 1, wherein a size of the plurality of piezoelectric elements is the same.

3. A robot comprising:
a plurality of linking portions;
joints connected to the plurality of linking portions; and
the piezoelectric driving device according to claim 2 which rotates the plurality of linking portions using the joints.

4. The piezoelectric driving device according to claim 1, wherein a direction of polarization of the plurality of piezoelectric elements is the same, when a driving voltage is applied to the plurality of piezoelectric elements.

5. The piezoelectric driving device according to claim 4, wherein the direction of polarization is a direction from the second electrode to the first electrode.

6. A robot comprising:
a plurality of linking portions;
joints connected to the plurality of linking portions; and
the piezoelectric driving device according to claim 5 which rotates the plurality of linking portions using the joints.

7. A robot comprising:
a plurality of linking portions;
joints connected to the plurality of linking portions; and
the piezoelectric driving device according to claim 4 which rotates the plurality of linking portions using the joints.

8. The piezoelectric driving device according to claim 1, wherein the second electrode of the first piezoelectric element and the second electrode of the second piezoelectric element form one continuous electrode.

9. The piezoelectric driving device according to claim 1, wherein the piezoelectric vibrating body is disposed on both surfaces of the first surface and the second surface of the vibrating plate.

10. The piezoelectric driving device according to claim 9, wherein one of the plurality of piezoelectric elements of the piezoelectric vibrating body disposed on the first surface and another of the plurality of piezoelectric elements of the piezoelectric vibrating body disposed on the second surface are connected in series by the second electrode of the one of the plurality of piezoelectric elements being connected to the first electrode of the another of the plurality of piezoelectric elements.

11. The piezoelectric driving device according to claim 1, wherein the first electrode is configured with a plurality of first electrodes, and
a substrate is formed between the plurality of first electrodes and the vibrating plate.

12. The piezoelectric driving device according to claim 11, wherein the substrate contains silicon.

13. The piezoelectric driving device according to claim 1, wherein the vibrating plate includes a protrusion which comes in contact with a body to be driven.

14. A robot comprising:
a plurality of linking portions;
joints connected to the plurality of linking portions; and
the piezoelectric driving device according to claim 1 which rotates the plurality of linking portions using the joints.

15. A driving method of the piezoelectric driving device according to claim 1, comprising:
applying an undulating voltage which is a voltage which periodically changes and in which a direction of an electric field applied to the piezoelectric member of one of the plurality of piezoelectric elements is one direction from one electrode to another electrode between the first electrode and the second electrode of the one of the plurality of piezoelectric elements.

16. A driving method of the piezoelectric driving device according to claim 2, comprising:
applying an undulating voltage which is a voltage which periodically changes and in which a direction of an electric field applied to the piezoelectric member of one of the plurality of piezoelectric elements is one direction from one electrode to another electrode between the first electrode and the second electrode of the one of the plurality of piezoelectric elements.

17. A driving method of the piezoelectric driving device according to claim 4, comprising:
applying an undulating voltage which is a voltage which periodically changes and in which a direction of an electric field applied to the piezoelectric member of one of the plurality of piezoelectric elements is one direction from one electrode among the electrodes to another electrode, between a fiat electrode and a between the first electrode and the second electrode of the piezoelectric elements.

18. A driving method of the robot according to claim 14, comprising
driving the piezoelectric driving device by applying a voltage which periodically changes, between the first electrode and the second electrode of the piezoelectric driving device, to rotate the plurality of linking portions using the joints.

19. A driving method of the robot according to claim 3, comprising
driving the piezoelectric driving device by applying a voltage which periodically changes, between the first electrode and the second electrode of the piezoelectric driving device, to rotate the plurality of linking portions using the joints.

20. A driving method of the robot according to claim 7, comprising
driving the piezoelectric driving device by applying a voltage which periodically changes, between the first electrode and the second electrode of the piezoelectric driving device, to rotate the plurality of linking portions using the joints.

\* \* \* \* \*